United States Patent
Pagnanelli

(10) Patent No.: US 9,654,128 B2
(45) Date of Patent: *May 16, 2017

(54) MULTI-MODE SAMPLING/QUANTIZATION CONVERTERS

(71) Applicant: Syntropy Systems, LLC

(72) Inventor: Christopher Pagnanelli, Huntington Beach, CA (US)

(73) Assignee: Syntropy Systems, LLC, Huntington Beach, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/209,711

(22) Filed: Jul. 13, 2016

(65) Prior Publication Data

US 2016/0322982 A1 Nov. 3, 2016

Related U.S. Application Data

(63) Continuation-in-part of application No. 14/818,502, filed on Aug. 5, 2015, now Pat. No. 9,419,637, which is a continuation-in-part of application No. 14/558,640, filed on Dec. 2, 2014, now Pat. No. 9,130,584, which is a continuation-in-part of application No. 13/844,948, filed on Mar. 16, 2013, (Continued)

(51) Int. Cl.
 *H03M 3/02* (2006.01)
 *H03M 1/06* (2006.01)
 *H03M 1/36* (2006.01)
 *H03M 3/00* (2006.01)

(52) U.S. Cl.
 CPC .......... *H03M 1/0626* (2013.01); *H03M 1/36* (2013.01); *H03M 3/322* (2013.01); *H03M 3/38* (2013.01); *H03M 3/468* (2013.01); *H03M 3/402* (2013.01); *H03M 3/418* (2013.01); *H03M 3/436* (2013.01)

(58) Field of Classification Search
 CPC ............ H03M 1/06; H03M 1/36; H03M 3/00; H03M 1/0626
 USPC ................. 341/118, 120, 143, 155
 See application file for complete search history.

(56) References Cited

U.S. PATENT DOCUMENTS 4,769,618 A 9/1988 Parish et al.
5,568,142 A 10/1996 Velazquez et al.
(Continued)

OTHER PUBLICATIONS

International Search Report and Written Opinion from corresponding PCT Application No. PCT/US15/42727.
(Continued)

*Primary Examiner* — Peguy Jean Pierre
(74) *Attorney, Agent, or Firm* — Joseph G. Swan, P.C.

(57) ABSTRACT

Provided are, among other things, systems, methods and techniques for converting a continuous-time, continuously variable signal into a sampled and quantized signal. According to one implementation, an apparatus includes multiple processing branches, each including: a bandpass noise-shaping circuit, a sampling/quantization circuit, and a digital bandpass filter. A combining circuit then combines signals at the processing branch outputs into a final output signal. The bandpass noise-shaping circuits include adjustable circuit components for changing their quantization-noise frequency-response minimum, and the digital bandpass filters include adjustable parameters for changing their frequency passbands.

23 Claims, 17 Drawing Sheets

Related U.S. Application Data now Pat. No. 8,917,198, which is a continuation of application No. 12/985,214, filed on Jan. 5, 2011, now Pat. No. 8,416,111.

(60) Provisional application No. 61/292,428, filed on Jan. 5, 2010, provisional application No. 61/414,413, filed on Nov. 16, 2010, provisional application No. 61/381,055, filed on Sep. 8, 2010.

(56) References Cited

U.S. PATENT DOCUMENTS

| | | | |
|---|---|---|---|
| 5,729,230 | A | 3/1998 | Jensen et al. |
| 6,032,048 | A | 2/2000 | Hartless et al. |
| 6,058,404 | A | 5/2000 | Mahant-Shetti et al. |
| 6,177,893 | B1 | 1/2001 | Velazquez et al. |
| 6,191,718 | B1 | 2/2001 | Matsumoto |
| 6,218,972 | B1 | 4/2001 | Groshong |
| 6,249,238 | B1 | 6/2001 | Steinlechner |
| 6,362,762 | B1 | 3/2002 | Jensen et al. |
| 6,426,983 | B1* | 7/2002 | Rakib ............... H04B 1/7102 375/346 |
| 6,473,013 | B1 | 10/2002 | Velazquez et al. |
| 6,683,550 | B2 | 1/2004 | Al-Awadhi |
| 6,771,198 | B2 | 8/2004 | Azadet |
| 6,873,280 | B2 | 3/2005 | Robinson et al. |
| 6,980,147 | B2 | 12/2005 | Mathis et al. |
| 7,079,068 | B2 | 7/2006 | Clement et al. |
| 7,119,724 | B1 | 10/2006 | Asami |
| 7,176,820 | B1 | 2/2007 | Fuller et al. |
| 7,193,544 | B1 | 3/2007 | Fitelson et al. |
| 7,212,874 | B2 | 5/2007 | Melanson |
| 7,280,063 | B2 | 10/2007 | Ozalevli et al. |
| 7,289,054 | B1 | 10/2007 | Watanabe |
| 7,321,324 | B2 | 1/2008 | Piovaccari |
| 7,324,036 | B2 | 1/2008 | Petre et al. |
| 7,358,885 | B2 | 4/2008 | Maxim et al. |
| 7,466,256 | B2 | 12/2008 | Brueske et al. |
| 7,519,513 | B2 | 4/2009 | Pupalaikis et al. |
| 7,535,394 | B2 | 5/2009 | Pupalaikis |
| 7,545,302 | B1 | 6/2009 | Silva et al. |
| 7,548,179 | B2 | 6/2009 | Jalan |
| 7,554,472 | B2 | 6/2009 | Puma |
| 7,956,781 | B2 | 6/2011 | Oliaei et al. |
| 8,284,824 | B1 | 10/2012 | Smaini et al. |
| 8,483,625 | B2 | 7/2013 | Milenkovic et al. |
| 8,830,107 | B1 | 9/2014 | Karthaus |
| 8,890,634 | B2 | 11/2014 | Mahoney et al. |
| 8,896,471 | B1 | 11/2014 | Pagnanelli |
| 8,924,524 | B2 | 12/2014 | Dalal et al. |
| 2002/0024385 | A1 | 2/2002 | Korn |
| 2003/0186671 | A1 | 10/2003 | Prodanov et al. |
| 2003/0206600 | A1 | 11/2003 | Vankka |
| 2004/0017854 | A1 | 1/2004 | Hansen et al. |
| 2004/0036638 | A1 | 2/2004 | Lipka |
| 2004/0174220 | A1 | 9/2004 | Toncich et al. |
| 2005/0190867 | A1* | 9/2005 | Sobchak ............... H04B 1/1036 375/346 |
| 2005/0254573 | A1 | 11/2005 | Midya et al. |
| 2006/0055485 | A1 | 3/2006 | Lobeek |
| 2006/0145900 | A1 | 7/2006 | Clement et al. |
| 2006/0202754 | A1 | 9/2006 | Yamamura et al. |
| 2006/0238395 | A1 | 10/2006 | Nagai et al. |
| 2007/0024480 | A1 | 2/2007 | Schwoerer |
| 2007/0241950 | A1 | 10/2007 | Petilli et al. |
| 2008/0280582 | A1 | 11/2008 | Su |
| 2008/0310200 | A1 | 12/2008 | Maksimovic et al. |
| 2009/0179830 | A1 | 7/2009 | Yui et al. |
| 2009/0244399 | A1 | 10/2009 | Cohen et al. |
| 2010/0328125 | A1 | 12/2010 | Pagnanelli |
| 2015/0256273 | A1 | 9/2015 | Sun et al. |

OTHER PUBLICATIONS

Prosecution history of parent U.S. Appl. No. 14/810,105 (now U.S. Pat. No. 9,391,656).

Ortmans and Gerfers, "Continuous-Time Sigma-Delta A/D Conversion: Fundamentals, Performance Limits and Robust Implementations", ch. 3, Springer Berlin Heidelberg 2006.

I. Galton and H. Jensen, "Delta Sigma Modulator Based A/D Conversion without Oversampling", IEEE Transactions on Circuits and Systems, vol. 42, 1995.

I. Galton and T Jensen, "Oversampling Parallel Delta-Sigma Modulator A/D Conversion", IEEE Transactions on Circuits and Systems, vol. 43, 1996).

Aziz, P., "Multi-band Oversampled Noise Shaping Analog to Digital Conversion" (PhD Thesis), University of Pennsylvania, 1996.

A. Beydoun and P. Benabes, "Bandpass/Wideband ADC Architecture Using Parallel Delta Sigma Modulators", 14th European Signal Processing Conference, 2006.

O. Shoaei, W. M. Snelgrove, "A Multi-Feedback Design for LC Bandpass Delta-Sigma Modulators", Proceedings—International Symposium on Circuits and Systems, vol. 1, 1995.

D. Anastassiou, "Error Diffusion Coding in A/D Conversion," IEEE Transactions on Circuits and Systems, vol. 36, pp. 1175-1186, 1989.

Hoyos, Sebastian et al., "Analog to digital conversion of ultra-wideband signals in orthogonal spaces", IEEE conference on Ultra Wideband Systems and Technologies, 2003, pp. 47-51.

Printout from http://www.eecg.toronto.edu/~kphang/ece1371/chap14_slides.pdf on Jul. 27, 2009.

Scott R. Velazquez, "High-Performance Advanced Filter Bank Analog-to-Digital Converter for Universal RF Receivers", Proceedings of the IEEE-SP International Symposium on Time-Frequency and Time-Scale Analysis, 1998. pp. 229-232.

Scott R. Velazquez et al., "Design of Hybrid Filter Banks for Analog/Digital Conversion", IEEE Transactions on Signal Processing, vol. 46, No. 4, Apr. 1998; pp. 956-967.

Scott R. Velazquez et al., "A hybrid filter bank approach to analog-to-digital conversion", Proceedings of the IEEE-SP International Symposium on Time-Frequency and Time-Scale Analysis (1994) pp. 116-119.

G. Ding et al., "Frequency-Interleaving Technique for High-Speed A/D Conversion", Proceedings of the 2003 International Symposium on Circuits and Systems, 2003, pp. 1-857-1-860.

P.P Vaidyanathan, "Analog/Digital Hybrid QMF Banks in A/D Conversion," Multirate Systems and Filter Banks, Englewood Cliffs, New Jersey: Prentice-Hall, 1993, pp. 163-164.

A. Petraglia and S.K. Mitra, "High-Speed A/D Conversion Using QMF Filter Banks," Proceeding IEEE International Symposium on Circuits and Systems, pp. 2797-2800, New Orleans, May 1990).

S.A. Jantzi, W.M. Snelgrove, and P.F. Ferguson Jr. "A Fourth-Order Bandpass Delta Sigma Modulator," IEEE Journal of Solid State Circuits, vol. 28, pp. 282-291, Mar. 1993.

Y. Matsuya, et. al. "A 16-bit Oversampling A-to-D Conversion Technology Using Triple-Integration Noise Shaping," IEEE Journal of Solid-State Circuits, vol. 22, pp. 921-929, Dec. 1987.

International Search Report and Written Opinion in PCT Application No. PCT/US2010/040115.

Eshraghi, A., et al., "A Comparative Analysis of Parallel Delta-Sigma ADC Architectures", IEEE Transactions on Circuits and Systems Part I: Regular Papers, vol. 51, No. 3, Mar. 1, 2004, pp. 450-458.

International Search Report and Written Opinion in corresponding PCT Application No. PCT/US2011/020268.

Philippe Benabes et al: "Extended frequency-band-decomposition sigma delta A/D converter", Analog Integrated Circuits and Signal Processing, Kluwer Academic Publishers, BO, vol. 61, No. 1, Jan. 9, 2009 (Jan. 9, 2009), pp. 75-85, XP019727213, ISSN: 1573-1979, DOI: D01:10.1007/S10470-008-9274-6.

Philippe Benabes et al: "A self-calibration scheme for extended frequency-band-decomposition sigma-delta ADC", Analog Integrated Circuits and Signal Processing, Kluwer Academic Publishers, BO, vol. 62, No. 3, Aug. 26, 2009 (Aug. 26, 2009), pp. 269-280, XP019766234, ISSN: 1573-1979.

Johns, D. and Martin, K., "Analog Integrated Circuit Design", John Wiley & Sons 1997, pp. 538-572.

(56) References Cited

OTHER PUBLICATIONS

Aziz, PM, et al., "Multi Band Sigma Delta Analog to Digital Conversion", IEEE International Conference on Acoustics, Speech, and Signal Processing, 1994. ICASSP-94, 1994.
Aziz, PM, et al., "An Overview of Sigma-Delta Converters: How a 1-bit ADC achieves more than 16-bit resolution", IEEE Signal Processing Magazine, vol. 13, Issue 1, Sep. 1996, pp. 61-84.
Prosecution history of parent U.S. Appl. No. 12/985,214.
Turner, Clay S., "Recursive Discrete-Time Sinusoidal Oscillators," IEEE Signal Processing Magazine, pp. 103-111, May 2003.
Prosecution history of parent U.S. Appl. No. 13/844,948.
Prosecution history of parent U.S. Appl. No. 14/558,640.
Prosecution history of parent U.S. Appl. No. 14/818,502.

* cited by examiner

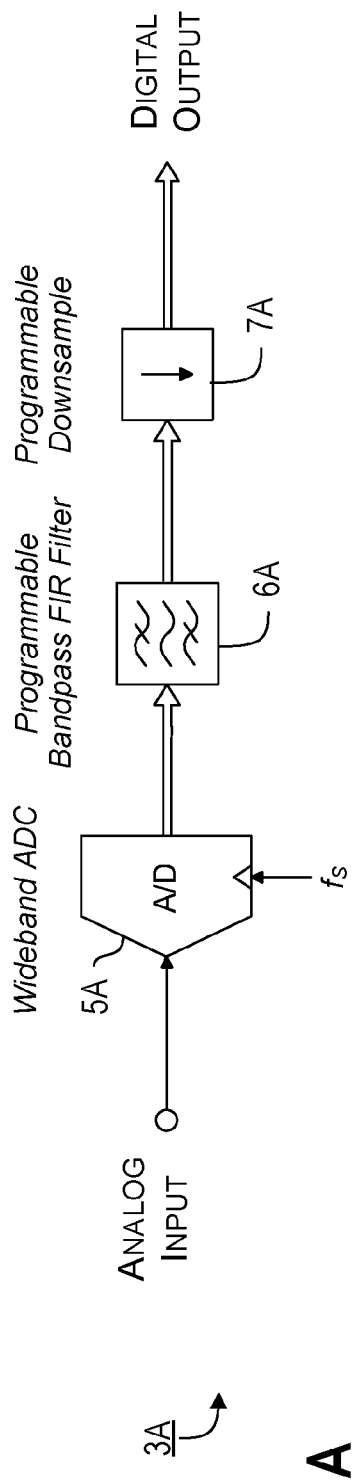
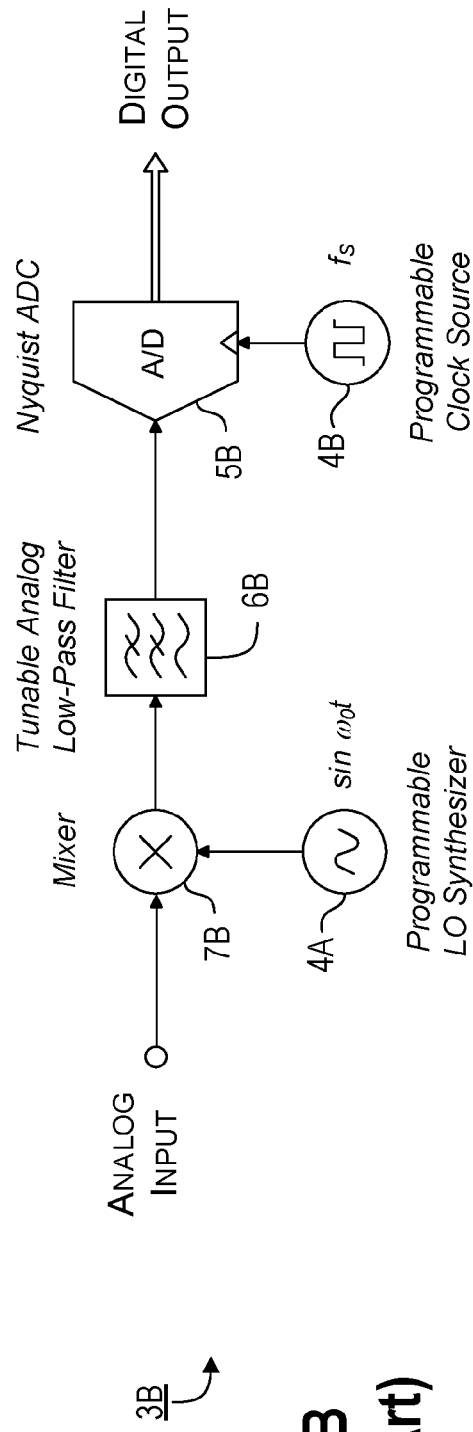
FIG. 1A (Prior Art)
FIG. 1B (Prior Art)

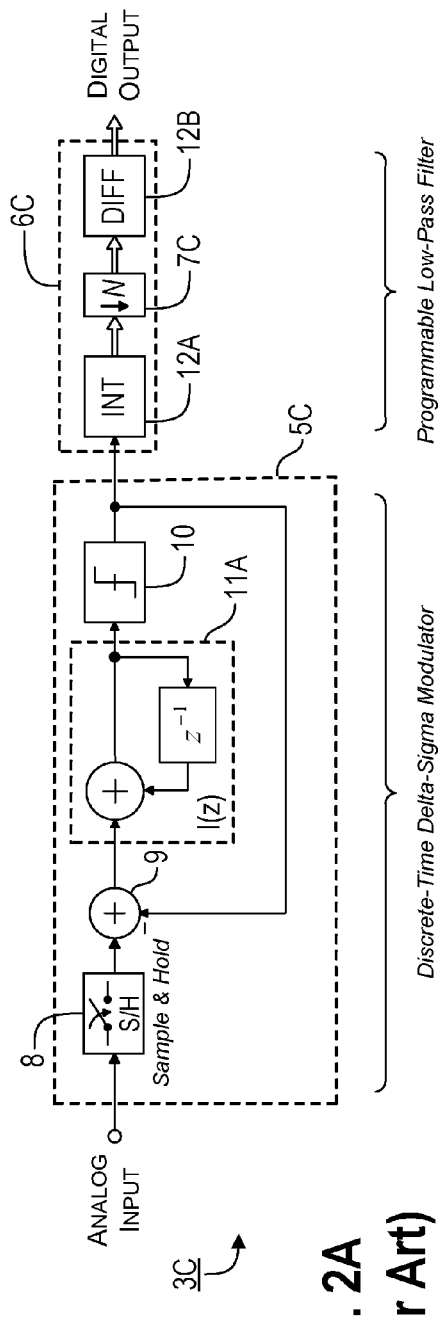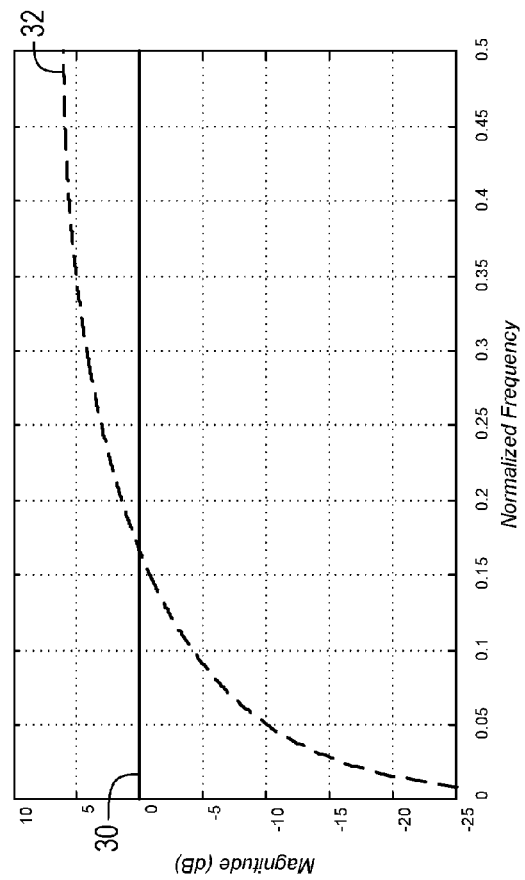
FIG. 2A
(Prior Art)
FIG. 2B
(Prior Art)

US 9,654,128 B2

MULTI-MODE SAMPLING/QUANTIZATION CONVERTERS

This application is a continuation in part of U.S. patent application Ser. No. 14/818,502, filed on Aug. 5, 2015, which is a continuation in part of U.S. patent application Ser. No. 14/558,640, filed on Dec. 2, 2014 (now U.S. Pat. No. 9,130,584), which is a continuation in part of U.S. patent application Ser. No. 13/844,948, filed on Mar. 16, 2013 (now U.S. Pat. No. 8,917,198), which is a continuation of U.S. patent application Ser. No. 12/985,214, filed on Jan. 5, 2011 (now U.S. Pat. No. 8,416,111), which claims the benefit of: U.S. Provisional Patent Application Ser. No. 61/292,428 (the '428 Application), filed on Jan. 5, 2010, and titled "Method and Apparatus for Multi-Mode Continuous-Time to Discrete-Time Transformation"; U.S. Provisional Patent Application Ser. No. 61/381,055 (the '055 Application), filed on, filed on Sep. 8, 2010, and titled "Multi-Bit Sampling and Quantizing Circuit"; and U.S. Provisional Patent Application Ser. No. 61/414,413 (the '413 Application), filed on Nov. 16, 2010, and titled "Sampling/Quantization Converters". All of the foregoing applications are incorporated by reference herein as though set forth herein in full.

FIELD OF THE INVENTION

The present invention pertains to systems, methods and techniques for converting a continuous-time (analog) signal to a sampled, quantized (discrete) signal. It is particularly applicable to the realization of reconfigurable converters that can be programmed to operate in any of multiple different modes, e.g., ranging from high-resolution, low-rate conversion at one extreme, to high-rate, moderate-resolution conversion at the other extreme.

BACKGROUND

Many applications in modern electronics require that continuous-time signals be converted to discrete signals for processing using digital computers and signal processors. Typically, this transformation is made using a conventional analog-to-digital converter (ADC). In general, conventional ADCs convert signals occupying a narrow frequency spectrum (i.e., narrowband signals) with relatively high precision (i.e., resolution), and convert signals occupying a wide frequency spectrum (i.e., wideband signals) with relatively moderate precision. However, the present inventor has discovered that existing ADC approaches exhibit shortcomings that limit overall performance, particularly in multi-mode applications where a single ADC is used to convert either narrowband signals with relatively high precision, or wideband signals with relatively moderate precision.

A multi-mode data converter is defined herein as one having high input bandwidth, and a means of being configured such that any continuous-time, continuously-variable input signal falling within that input bandwidth, can be converted with an effective resolution (i.e., number of effective bits) that is inversely related to the actual bandwidth of the signal. Therefore, a multi-mode converter transforms narrowband analog signals (e.g., high-fidelity audio) to discrete signals with higher precision than wideband signals (e.g., high-speed data communications). Due to parallel processing and other innovations, the digital information processing bandwidth of computers and signal processors has advanced beyond the capabilities of state-of-the art, multi-mode ADCs. Multi-mode converters with higher input bandwidth and improved resolution are desirable in certain circumstances, and existing solutions are limited by input bandwidth, effective conversion resolution, or both.

The resolution of an ADC is a measure of the precision with which a continuous-time continuously variable (analog) signal can be transformed into a sampled, quantized (discrete) signal, and typically is specified in units of effective bits (B). When a continuous-time continuously variable signal is converted into a discrete-time discretely variable signal through sampling and quantization, the quality of the signal degrades because the conversion process introduces quantization, or rounding, noise. High-resolution converters introduce less quantization noise because they transform analog signals into discrete signals using a rounding operation with finer granularity. Instantaneous conversion bandwidth is limited by the Nyquist criterion to a theoretical maximum of one-half the converter sample rate (the Nyquist limit). High-resolution conversion (of ≥10 bits) conventionally has been limited to instantaneous bandwidths of about a few gigahertz (GHz) or less.

FIGS. 1A&B illustrate block diagrams of conventional, multi-mode data converters 3A&B, respectively. A multi-mode converter generally consists of a core analog-to-digital converter (e.g., converter 5A or 5B), a digital filter (e.g., filter 6A) or an analog filter (e.g., filter 6B), and a digital function (e.g., circuit 7A) for signal downsampling (e.g., decimation) or an analog function (e.g., circuit 7B) for signal downconversion.

The circuit 3A illustrated in FIG. 1A employs an oversampling approach consisting of: 1) moderate resolution ADC 5A with high instantaneous bandwidth (i.e., effective sample rate), 2) digital finite impulse response (FIR) filter 6A, and 3) programmable digital decimator 7A. Core quantizing element 5A samples and digitizes continuous-time, continuously variable signals at a fixed sample rate $f_S$ that is twice the input bandwidth of the converter, such that for narrowband input signals, the sample rate $f_S$ is significantly higher than twice the bandwidth $f_B$ of the input signal (i.e., $f_S \gg f_B$), and for a wideband input signal, the sample rate $f_S$ is only marginally higher than twice the signal bandwidth $f_B$ (i.e., $f_S \approx 2 \cdot f_B$). The purpose of digital FIR filter 6A is to attenuate quantization noise that is outside the input signal bandwidth $f_B$ and improve effective converter resolution by an amount ΔB equal to $$\Delta B = \frac{1}{6} \cdot 10 \cdot \log_{10}\left(\frac{1}{2} \cdot \frac{f_S}{N_B}\right) \text{ bits,}$$

where $N_B$ is the equivalent noise bandwidth of digital filter 6A. At the potential expense of high power consumption, the impulse response of FIR filter 6A conventionally is many samples long (i.e., a large number of coefficient multiplications, or taps, are included) so that the filter can produce either wideband or narrowband frequency responses with high stopband attenuation (i.e., the filter can provide a sufficient degree of frequency selectivity). According to the above equation, which assumes an output noise spectral density that is white (i.e., spectrally flat), the conversion resolution of the multi-mode converter shown in FIG. 5A improves by approximately 0.5 bits for every 50% reduction in conversion bandwidth (i.e., 0.5 bits/octave). Optional decimator 7A reduces the data rate at the converter output to twice the input signal bandwidth ($f_B$), or greater.

A conventional alternative to the oversampling approach shown in FIG. 1A is circuit 3B illustrated FIG. 1B. Multi-mode converter circuit 3B shown in FIG. 1B uses a Nyquist-rate, or baud-sampled, approach consisting of: 1) analog downconverter 7B, 2) tunable, analog (anti-aliasing) lowpass filter 6B, and 3) ADC 5B with a programmable sample rate $f_S$. Core quantizing element 5B samples and digitizes continuous-time, continuously variable input signals at a sample rate $f_S$ that is equal to, or slightly higher than, twice the bandwidth $f_B$ of the input signal (i.e., $f_S \geq 2 \cdot f_B$). Analog downconverter 7A translates the analog input signal from an intermediate frequency (IF) to baseband, so that ADC 5B can operate with a sample rate $f_S$ that is at or near the Nyquist limit (i.e., $f_S \approx 2 \cdot f_B$). To prevent aliasing, analog lowpass filter 6B is "tuned" to a bandwidth that is one-half the sampling frequency $f_S$ of ADC 5B. The noise bandwidth $N'_B$ of ADC 5B is equal to one-half the sample rate $f_S$, and since the output noise power of ADC 5B is proportional to its noise bandwidth (i.e., assuming a white output noise spectral density), lowering the sampling frequency $f_S$ of ADC 5B improves conversion resolution by $$\Delta B \geq \frac{1}{6} \cdot 10 \cdot \log_{10}(\Delta f_S) \text{ bits,}$$

or equivalently $$\Delta B \geq \frac{1}{6} \cdot 10 \cdot \log_{10}(\Delta N'_B) \text{ bits.}$$

In the above equations, $\Delta f_S$ is the ratio of initial (i.e., reference) sample rate to final sample rate, and $\Delta N'_B$ is the ratio of initial (i.e., reference) ADC noise bandwidth to final ADC noise bandwidth. The "≥" operator in the above equation reflects the tendency of ADC performance to improve with lower sample rates, such as for example, due to longer settling periods that reduce transient errors. According to the above equations, therefore, the conversion resolution of the multi-mode converter, shown in FIG. 5B, improves by 0.5 bits for every 50% reduction in conversion bandwidth (i.e., 0.5 bits/octave), plus an additional amount that depends on the extent to which the precision of core ADC 5B improves at lower sample rates $f_S$. This additional benefit from lower sample rates $f_S$ is realized at the expense of more complicated analog circuitry that includes tunable analog filter 6B, analog downconverter 7B, programmable local oscillator (LO) synthesizer 4A, and programmable ADC clock source 4B.

The core oversampling/wideband and Nyquist-rate ADCs 5A&B used in prior-art multi-mode converters 3A&B, shown in FIGS. 1A&B, respectively, include those based on conventional flash and conventional pipelined ADC architectures. Conventional flash converters potentially can achieve very high instantaneous (input) bandwidths. However, the resolution of flash converters can be limited by practical implementation impairments that introduce quantization errors, such as sampling jitter, thermal noise, and rounding/gain inaccuracies caused by component tolerances. Although flash converters potentially could realize high resolution at instantaneous bandwidths greater than 10 GHz, this potential has been unrealized in commercial offerings. Conventional pipeline converters generally have better resolution than conventional flash converters, because they employ complex calibration schemes to reduce the quantization/rounding errors caused by these practical implementation impairments. However, pipeline converters typically can provide less than about 1 GHz of instantaneous bandwidth.

Furthermore, for conventional multi-mode ADCs, the resolution performance improvement of 0.5 bits per octave (i.e., factor of two) reduction in conversion bandwidth is generally realized only to the extent that the ADC output noise spectral density is white. The resolution performance of ADCs that operate at high sample rates, however, tends to be limited by sampling jitter, which is highly colored and narrowband. Possibly due to the performance limitations imposed by practical implementation impairments, such as sampling jitter, conventional multi-mode converters have not been demonstrated with high-resolution at bandwidths greater than a few GHz.

As an adaptation to the conventional oversampling approach illustrated in FIG. 1A, multi-mode ADCs can incorporate a lowpass, discrete-time (DT) noise-shaping operation. Circuit 3C shown in FIG. 2 uses conventional, lowpass delta-sigma (ΔΣ) modulator 5C (made up of sample-and-hold circuit 8, subtractor 9, hard limiter 10 and integrator 11A) as the core quantizing element; and employs a lowpass filter consisting of integration 12A, decimation 7C, and differentiation 12B functions. As the name implies, a delta-sigma modulator (e.g., modulator 5C) shapes the noise introduced by a coarse quantizer (e.g., quantizer 10) by performing a difference (i.e., delta) operation (e.g., within subtractor 9) and an integration (i.e., sigma) operation (e.g., within integrator 11A). Conventionally, the integration operation has a transfer function given by $$I(z) = \frac{1}{1 - z^{-1}}.$$

The result, illustrated in FIG. 2B for first order noise shaping, is signal transfer function (STF) response 30 that is all-pass and quantization noise transfer function (NTF) response 32 that is high-pass. This unequal processing of signal and quantization noise allows low-frequency, narrowband signals to be converted with higher resolution than wideband signals, because a narrowband lowpass filter (e.g., lowpass filter 6C) can attenuate more quantization noise due to the noise-shaped response. Compared to multi-mode converters without noise shaping (e.g., converter 3A shown in FIG. 1A), however, this noise-shaped response does not improve conversion resolution of wideband input signals, and degrades conversion resolution of high-frequency, narrowband input signals. Also, the present inventor has discovered that the sampling jitter sensitivity of discrete-time, noise-shaped converters generally is not better than that of oversampled converters without noise shaping, due to use of explicit (e.g., sample-and-hold function 8) or implicit (e.g., switched-capacitor integrators) sampling functions that are not subjected to the noise-shaped response.

In multi-mode applications, noise-shaped converters can offer very high resolution, but the lowpass filtering operation required to attenuate shaped quantization noise at high frequency generally limits the utility of noise-shaped converters to applications requiring only low input bandwidth. Multi-mode converters without noise shaping can realize wide input bandwidth, but their resolution performance is generally limited by practical implementation impairments such as sampling jitter, thermal noise, and rounding/gain inaccuracies. Therefore, the need exists for a multi-mode ADC technology that is cable of wide bandwidth, with resolution performance that is not limited by these practical implementation impairments.

SUMMARY OF THE INVENTION

The present invention addresses these needs by providing improved systems, methods, apparatuses and techniques for conversion of analog signals to discrete signals, particularly for use in multi-mode data converter applications.

In one specific embodiment, the invention is directed to an apparatus for converting a continuous-time, continuously variable input signal into a sampled and quantized output signal, where the continuous-time, continuously variable input signal can vary in center frequency and bandwidth. In this embodiment, the apparatus: (1) decomposes the input signal into distinct frequency subbands that span (encompass) a desired input signal frequency range; (2) independently processes each frequency subband; and then (3) separates and/or combines the frequency subbands into channels which preserve desired portions of the frequency spectrum occupied by the input signal, and which provide output signals representing quantized, baseband versions of the input signal spectrum. The apparatus includes: (1) an input line for accepting an input signal that is continuous in time and continuously variable; (2) a plurality of processing branches coupled to the input line; and (3) an output Add-Multiplex Array (AMA) coupled to outputs of the plurality of processing branches. Each of such processing branches includes: (a) a continuous-time, quantization-noise-shaping circuit, (b) a sampling/quantization circuit coupled to the output of the continuous-time quantization-noise-shaping circuit, (c) a digital, downsampling bandpass filter coupled to an output of the sampling/quantization circuit, and (d) one or more lines coupling the input and output of the sampling/quantization circuit back into the continuous-time, quantization-noise-shaping circuit. The output AMA includes a plurality of add-multiplex arrays that combine the outputs of processing branches, or alternatively, combine the outputs of other add-multiplex arrays, with each of the add-multiplex arrays including: (a) a multi-input adder coupled to a set of input lines, (b) a first, multi-input multiplexer coupled to the same set of input lines, and (c) a second, multi-input multiplexer coupled to the outputs of the adder and to the outputs of the first multiplexer. The continuous-time, quantization-noise-shaping circuits in different ones of the processing branches produce quantization-noise minima at different frequencies that vary depending on the spectrum (i.e., center frequency and bandwidth) of the input signal, and the quantization noise minimum for each of the continuous-time, quantization-noise-shaping circuits corresponds to a frequency band, or subband, selected by the digital bandpass filter in the same processing branch.

In a somewhat more generalized embodiment, the invention is directed to an apparatus for converting a continuous-time, continuously variable signal into a sampled and quantized signal, and includes: an input line for accepting an input signal that is continuous in time and continuously variable; a plurality of processing branches coupled to the input line; and a combining circuit, coupled to outputs of a plurality of the processing branches, that combines signals on such outputs into a final output signal. Each of such processing branches includes: (a) a bandpass noise-shaping circuit, (b) a sampling/quantization circuit coupled to an output of the bandpass noise-shaping circuit, and (c) a digital bandpass filter coupled to an output of the sampling/quantization circuit. In addition, each of a plurality of the bandpass noise-shaping circuits includes an adjustable circuit component which, when adjusted, changes the center frequency of a stopband region in the quantization-noise response of such bandpass noise-shaping circuit; and each of a plurality of the digital bandpass filters includes at least one adjustable parameter which, when adjusted, changes a frequency passband of such digital bandpass filter.

In a second specific embodiment, the invention is directed to an apparatus for converting a continuous-time, continuously variable input signal into a sampled and quantized output signal, e.g., where the continuous-time, continuously variable input signal can vary in center frequency and bandwidth. In this embodiment, the apparatus: (1) converts the continuous-time, continuously variable input signal into a sampled and quantized (discrete) signal; (2) decomposes the quantized signal into one or more distinct frequency subbands, e.g., that span (or encompass) a desired input signal frequency range; (3) independently processes each frequency subband; and then (4) separates and/or combines the frequency subbands into channels which preserve desired portions of the frequency spectrum occupied by the input signal, and which provide output signals representing quantized, baseband versions of the input signal spectrum. The apparatus preferably includes: (1) an input line for accepting an input signal that is continuous in time and continuously variable; (2) a plurality of processing branches coupled to the input line; and (3) a combining circuit, such as an output Add-Multiplex Array (AMA), coupled to outputs of the plurality of processing branches. Each of the processing branches includes: (a) a quadrature frequency downconverter which uses discrete-time cosine and sine sequences to generate in-phase and quadrature outputs at baseband; (b) a first moving-average filter coupled to the in-phase output of the quadrature frequency downconverter; (c) a second moving-average filter coupled to the quadrature output of the quadrature frequency downconverter; and (d) a quadrature frequency upconverter coupled to outputs of the first and second moving-average filters, for generating a higher (e.g., intermediate) frequency output from in-phase and quadrature inputs using discrete-time cosine and sine sequences. In the present embodiment, the output AMA includes a plurality of add-multiplex arrays that combine the outputs of processing branches, or alternatively, combine the outputs of other add-multiplex arrays, with each of the add-multiplex arrays including: (a) a multi-input adder coupled to a set of input lines, (b) a first, multi-input multiplexer coupled to the same set of input lines, and (c) a second, multi-input multiplexer coupled to the outputs of the adder and to the outputs of the first multiplexer. The frequencies of the cosine and sine sequences preferably are programmable, and the window lengths (i.e., the number of samples averaged) of the first and second moving-average filters preferably also are programmable, such that each of the plurality of processing branches has a bandpass frequency response with a programmable center frequency and a programmable bandwidth. In addition, the frequency responses of the plurality of processing branches preferably form a digital filter bank with near perfect signal reconstruction properties, such that in conjunction with the AMA, subbands can be separated into narrowband channels, or can be combined to create aggregate channels with progressively wider bandwidth and progressively lower conversion resolution (i.e., a progressive lower number of effective bits). Certain implementations of the foregoing apparatus include: (1) at least one sampling/quantization circuit having an input coupled to the input line and an output coupled to inputs of at least some of the processing branches; and/or (2) at least one moving-average filter that includes a downsampling operation.

In a third specific embodiment, an apparatus for converting a continuous-time, continuously variable signal into a sampled and quantized signal includes: an input line for accepting an input signal that is continuous in time and continuously variable; multiple processing branches having inputs coupled to the input line; and a combining circuit, coupled to outputs of a plurality of the processing branches, that combines signals on such outputs into a final output signal. Each of the processing branches includes: (a) a quadrature frequency downconverter, which uses discrete-time cosine and sine sequences to generate in-phase and quadrature outputs at baseband, (b) a first lowpass filter coupled to the in-phase output of the quadrature frequency downconverter, (c) a second lowpass filter coupled to the quadrature output of the quadrature frequency downconverter, and (d) a quadrature frequency upconverter coupled to outputs of the first and second moving-average filters, which uses discrete-time cosine and sine sequences to convert in-phase and quadrature inputs to a higher frequency output. The frequency response of each of the first and second lowpass filters has a magnitude that varies approximately with frequency according to the product of raised $\sin(x)/x$ functions. Each of a plurality of the processing branches includes at least one adjustable parameter which, when adjusted, changes at least one of: (i) a frequency of at least one of the cosine or sine sequences, or (ii) a bandwidth of at least one of the first lowpass filter or the second lowpass filter.

According to any of the embodiments of the invention described herein, the frequency subbands processed by the various branches typically depend on the input signal center frequency and bandwidth, and are configured to span, or approximately span, the frequency range of the input signal. The various branches preferably are configured to process narrow frequency bands for narrowband input signals, and are configured to process proportionally wider frequency bands for wideband input signals. Also, the various branches preferably are configured so that the frequency bands are localized at or near the center frequency of the input signal. Configuration of the various processing branches in this manner enables narrowband input signals to be converted with higher resolution than wideband input signals. In multi-mode converter applications, such a reconfigurable apparatus typically can provide a better combination of high resolution and wide input bandwidth than is possible with conventional multi-mode converters. Such an apparatus can be used for various commercial, industrial and military applications, e.g., in various direct conversion sensors, software-defined or cognitive radios, multi-channel communication receivers, all-digital RADAR systems, high-speed industrial data acquisition systems.

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the attached drawings. However, it should be understood that the drawings merely depict certain representative and/or exemplary embodiments and features of the present invention and are not intended to limit the scope of the invention in any manner. The following is a brief description of each of the attached drawings.

FIG. 1A is a block diagram of a conventional multi-mode converter having a wideband ADC core with digital filtering and decimation; and FIG. 1B is a block diagram of a conventional multi-mode converter having a Nyquist-sampled ADC core with analog downconversion and filtering.

FIG. 2A is a block diagram of a conventional multi-mode converter having a discrete-time, delta-sigma modulator with first-order response; and FIG. 2B illustrates the input signal transfer function (STF) and quantization-noise transfer function (NTF) for a conventional, first-order, lowpass delta-sigma modulator.

DESCRIPTION OF THE PREFERRED EMBODIMENT(S)

Figure 3A:
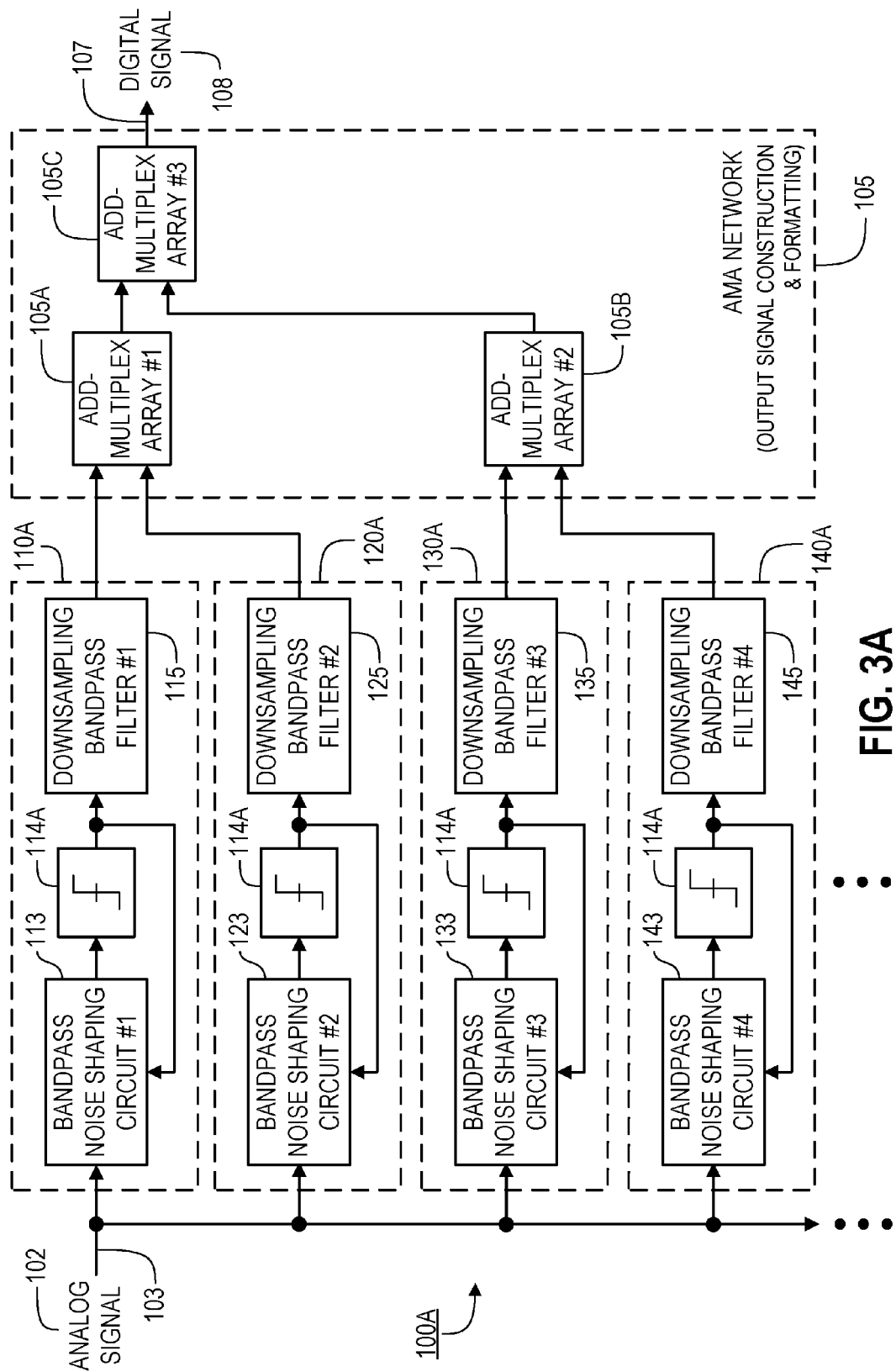
FIG. 3A is a simplified block diagram of a multi-mode converter, according to a representative embodiment of the present invention, that utilizes multiple processing branches, each of which including bandpass noise shaping, sampling/quantization, and bandpass filtering.

The present disclosure is related to the disclosures set forth in: U.S. patent application Ser. No. 12/985,238, titled "Sampling/Quantization Converters" and filed Jan. 5, 2011 (now U.S. Pat. No. 8,299,947), U.S. patent application Ser. No. 13/363,517, filed Feb. 1, 2012, and U.S. patent application Ser. No. 12/824,171 (the '171 Application) and its corresponding PCT Application Serial No. PCT/US2010/040115 (published as WO 2010/151851), which were filed on Jun. 26, 2010, by the present inventor with the title "Sampling/Quantization Converters". Each of the foregoing applications is incorporated by reference herein as though set forth herein in full.

A preferred converter according to certain embodiments of the present invention uses a technique that sometimes is referred to herein as Multi-Channel Bandpass Oversampling (MBO). Such a technique shares some structural similarities with some conventional multi-mode analog-to-digital converters, in that the multi-mode MBO converter employs oversampling and noise shaping to overcome the performance limitations caused by quantization noise and rounding errors. However, a multi-mode MBO converter according to the preferred embodiments of the present invention incorporates one or more of the following technological innovations to improve input bandwidth and resolution: (1) use of multiple processing branches, with noise shaping, significantly improves the degree to which narrowband signals are converted with higher resolution (i.e., conversion resolution increases by more than 0.5 bits per octave reduction in signal bandwidth); (2) use of bandpass (preferably second-order or higher) oversampling eliminates the need for analog downconversion (e.g., compared to multi-mode converters with Nyquist-sampled ADC cores) and enables improved conversion resolution of high-frequency input signals (e.g., compared to conventional oversampling converters with noise shaping); and (3) use of continuous-time (CT) noise shaping, preferably with Diplexer Feedback Loops (DFLs), reduces sensitivity to colored noise and improves the quality of the noise-shaped response at very high sample rates (e.g., compared to conventional multi-mode converters that employ discrete-time delta-sigma (ΔΣ) modulators). Such techniques can in some respects be thought of as a unique and novel method of combining two distinct conventional techniques—bandpass oversampling and filter bank (i.e., frequency decomposition into multiple channels) processing. As discussed in more detail below, the use of such techniques often can overcome the problems of limited input bandwidth and conversion resolution associated with conventional multi-mode data converters.

A preferred converter according to other embodiments of the present invention uses a technique that sometimes is referred to herein as Bandpass Moving Average (BMA) filtering. Unlike conventional finite impulse response (FIR) filtering, which utilizes a large number of coefficient multipliers to generate a bandpass impulse response, BMA filtering is a novel alternative which generates bandpass impulse responses using quadrature downconversion, moving-average functions, and quadrature upconversion. More specifically, whereas the impulse response length of a conventional FIR filter is limited by the number of coefficient multipliers, a BMA filter can employ only four multiplication operations to realize an impulse response of arbitrary length. As discussed in more detail below, the BMA technique enables the construction of programmable digital filters which combine high frequency selectivity, with both significantly reduced complexity and low power dissipation. Therefore, use of such a technique can result in improved conversion resolution compared to conventional multi-mode data converters.

Figure 4:
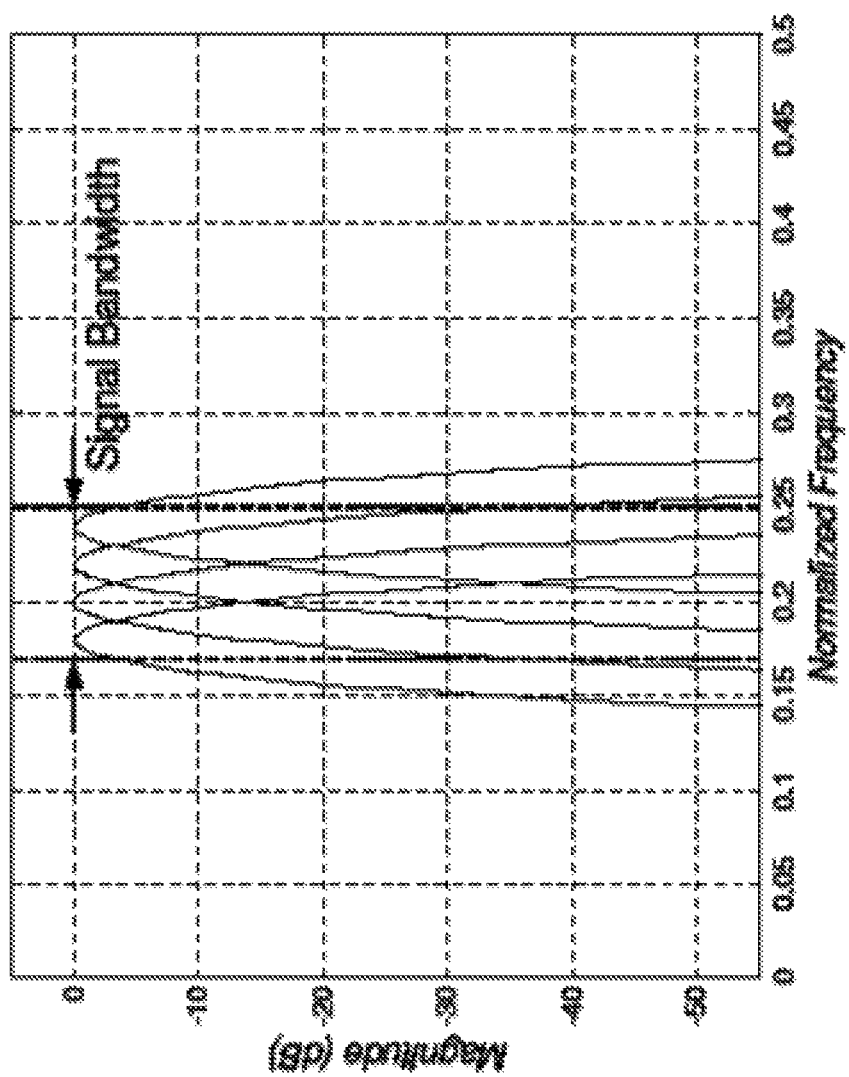
FIG. 4 illustrates input signal transfer functions (i.e., Bandpass Moving Average frequency responses) for the processing branches of a representative embodiment of the present invention that includes four processing branches configured for an input signal with a normalized center frequency of approximately 0.21 hertz (Hz), and a normalized bandwidth of approximately 0.08 Hz.

Simplified block diagrams of converters 100A&B according to certain preferred embodiments of the present invention are illustrated in FIGS. 3A&B, respectively. In the preferred embodiments, converters 100A&B separately processes M different frequency bands for a continuous-time continuously variable signal (e.g., signal 102), using a separate branch (e.g., one of branches 110A&B, 120A, 130A&B and 140A) to process each such band, and then merges all the branch outputs within an AMA 105, in order to provide the output digital signal 108 (on output line 107). Although the present descriptions generally concern examples that include two or four such branches, these examples should not be considered limiting and any other number M of branches instead may be used. In the preferred embodiments, these M different frequency bands (subbands) together encompass the entire frequency spectrum of input signal 102, such that the spectral characteristics (i.e., center frequency and bandwidth) of each of the M processing bands depend on the spectral characteristics of the input signal. In one embodiment of the invention, therefore, the M different frequency bands collectively have a bandwidth approximately equal to $1/M\ f_B$ and have center frequencies that are orthogonal, or at least approximately orthogonal, with respect to the converter output data rate, as illustrated in FIG. 4 for the case of an input signal with a normalized center frequency of approximately 0.21 Hz and a normalized bandwidth of approximately 0.08 Hz.

Figure 3B:
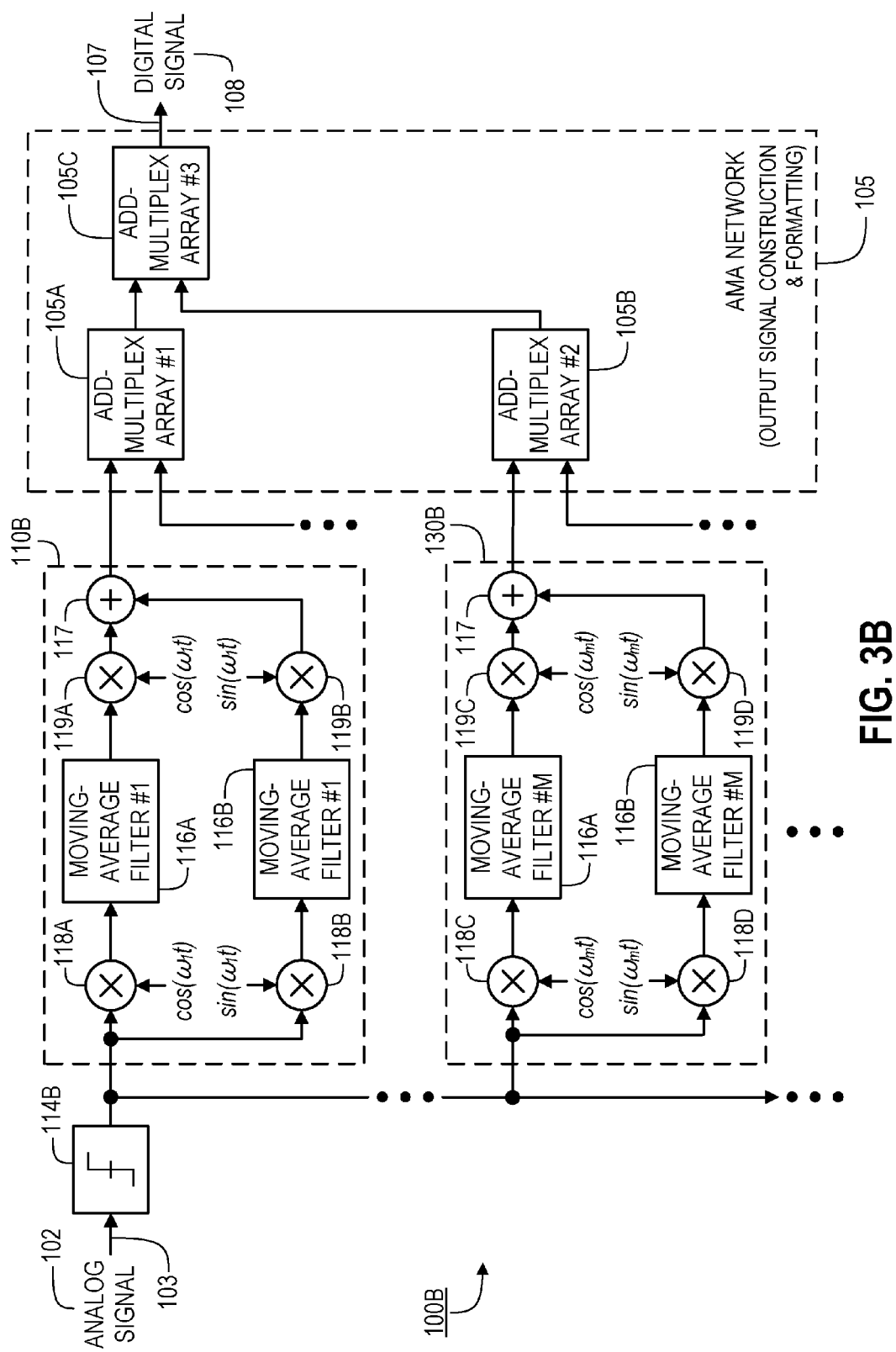
FIG. 3B is a simplified block diagram of a multi-mode converter, according to a representative embodiment of the present invention, that utilizes multiple processing branches, each of which including quadrature downconversion, moving-average filtering, and quadrature upconversion.

Analog signal 102 is input on line 103 that could be implemented, e.g., as a physical port for accepting an external signal or as an internal wire, conductive trace or a similar conductive path for receiving a signal from another circuit within the same device. Referring to representative converter 100A of FIG. 3A, input signal 102 is provided directly to each of the branches (e.g., branches 110A, 120A, 130A and 140A). In alternate embodiments, however, input signal 102 can be coupled to such branches in any other manner. For example, input signal 102 is coupled to the various processing branches (e.g, processing branches 110B and 130B) through quantizer 114B in representative converter 100B of FIG. 3B. As used herein, the term "coupled", or any other form of the word, is intended to mean either directly connected or connected through one or more other processing blocks, e.g., for the purpose of preprocessing. It should also be noted that any number of branches may be used and, as discussed in more detail below, increasing the number of branches generally increases the resolution of converters 100A&B.

In any event, in the representative embodiment of converter 100A each such branch (e.g., branch 110A, 120A, 130A or 140A) primarily processes a different frequency band (subband) and includes: a bandpass noise shaping circuit (e.g., circuit 113, 123, 133 or 143), a sampling/ quantization circuit (e.g., circuits 114A), and a digital bandpass filter (e.g., filter 115, 125, 135 or 145). In the alternate embodiment of converter 100B, which employs no frequency-dependent noise shaping, two or more of the processing branches, with their associated bandpass responses (e.g., the effective bandpass response of the combination of downconverters 118A-D, moving-average filters 116A&B, and upconverters 119A-D within processing branches 100B or 130B), are coupled to a common sampling/quantization circuit (e.g., circuit 114B), such that the sampling/quantization circuit simultaneously processes multiple frequency subbands, including possibly every frequency subband. Referring back to exemplary converter 100A of FIG. 3A, each bandpass noise shaping circuit (e.g., circuit 113, 123, 133 or 143) realizes a quantization noise transfer function (NTF) with a minimum (i.e., notch or null) at or near the frequency band(s) (more preferably, the center of the frequency band(s)) that is/are intended to be processed by its respective branch. The notch in the NTF response preferably is not fixed, but is configured (i.e., programmed) depending on the frequency range of the input signal. Each sampling/quantization circuit 114A preferably is identical to the others and is implemented as a single-bit quantizer, sometimes referred to herein as a hard limiter. It should be noted that in applications where conversion at zero frequency (i.e., DC) is desired, one of the processing branches preferably includes a lowpass noise shaping circuit, and a corresponding digital bandpass filter that is centered at zero frequency to produce a lowpass response.

As discussed in greater detail below, noise shaping, when included (e.g., such as that included in converter 100A), preferably is realized using a Diplexer Feedback Loop (DFL), meaning that the signal input into sampling/quantization circuit 114A and the signal output by sampling/quantization circuit 114A are fed back, diplexed (i.e., independently filtered, combined, and then optionally jointly filtered), and combined with input signal 102 (or a preprocessed version of it) so that quantization errors in earlier samples can be taken into account in generating later quantized samples and so that quantization noise is appropriately shaped away from the frequency band of the current processing branch. In alternate embodiments, bandpass noise shaping is performed by other conventional means (as discussed in more detail in the Noise Shaping Considerations section). Each downsampling bandpass filter (e.g., filter 115, 125, 135 or 145), preferably a Bandpass Moving Average filter, selects out the frequency band being processed within its respective branch. Preferably, the output signal 108 is constructed and/or formatted using add-multiplex arrays (e.g., arrays 105A-C), such that depending on the desired application, processing branch outputs can be combined (i.e., added) into single composite (i.e., wideband) channels, or kept separate (e.g., multiplexed) into multiple distinct (e.g., narrowband) channels.

Use of a hard limiter for the sampling/quantization circuits 114A generally is preferred in embodiments which include noise shaping (e.g., MBO converter 100A), because due to its simplicity, a hard limiter usually allows for the maximum possible sampling rate and is not as subject to differential nonlinearities or rounding errors (as opposed to quantization noise) associated with multi-bit quantizers. However, use of multi-bit quantizers potentially can improve converter resolution at the expense of instantaneous bandwidth, and is preferred in embodiments where sampling/quantization does not occur in conjunction with noise shaping. In the preferred embodiments, the sampling rate $f_S$ of the individual sampling/quantization circuits (e.g., circuits 114A&B) is twice the input bandwidth of the converter (e.g., converters 100A&B) as a whole, such that the downsampling bandpass filter (or alternatively, a downsampling operation within a moving-average filter) preferably is configured for a downsampling factor $N \leq \frac{1}{2} \cdot f_S/f_B$ (i.e., the excess-rate oversampling ratio), where $f_B$ is the bandwidth of the input signal. In alternate embodiments where the input signal bandwidth $f_B$ is equal to, or approximately equal to, the input bandwidth (i.e., instantaneous bandwidth) of the converter, the preferable downsampling factor is $N=1$. In general, higher downsampling factors result in higher conversion resolution (i.e., narrowband signals are converted with higher resolution than wideband signals). At the same time, the desired overall effective resolution of converters 100A&B generally can be achieved, independent of the downsampling factor (i.e., or sampling rate $f_S$), by appropriately selecting design parameters such as: (1) the number M of processing branches (corresponding to the number M of individual frequency bands processed); (2) the order of the noise-shaped response; and/or (3) the bandwidth and stopband attenuation of the digital bandpass filters.

For embodiments employing a multi-bit sampling/quantization circuit, the improved circuit described in the '055 Application is preferred. However, it is also possible to use any other multi-bit sampling/quantization circuit, such as the conventional circuit described in the '055 Application.

Noise Shaping Considerations

In certain preferred embodiments of the invention, bandpass noise shaping (e.g., in circuits 113, 123, 133 and 143) is employed to: (1) eliminate the complexity associated with analog downconversion and tunable anti-aliasing filtering in conventional multi-mode converters with Nyquist-sampled ADC cores; (2) improve the conversion resolution of high-frequency input signals compared to conventional multi-mode converters with lowpass noise shaping; and (3) increase the degree to which narrowband signals are converted with higher resolution to beyond 0.5 bits per octave reduction in signal bandwidth (i.e., 0.5 bits/octave). For bandpass oversampling, a 50% reduction in the input signal bandwidth is equivalent to doubling the excess-rate oversampling ratio N and produces an increase in converter resolution of $0.5 \cdot (1+P)$ bits, where P is the order of the noise-shaped response. See Johns, D. and Martin K., "Analog Integrated Circuit Design", JohnWiley & Sons 1997. Therefore, for second-order, bandpass noise shaping (i.e., P=2), resolution improves by 1.5 bits/octave, and for fourth-order, bandpass noise shaping (i.e., P=4), resolution improves by 2.5 bits/octave, regardless of input signal center frequency.

Figure 5A:
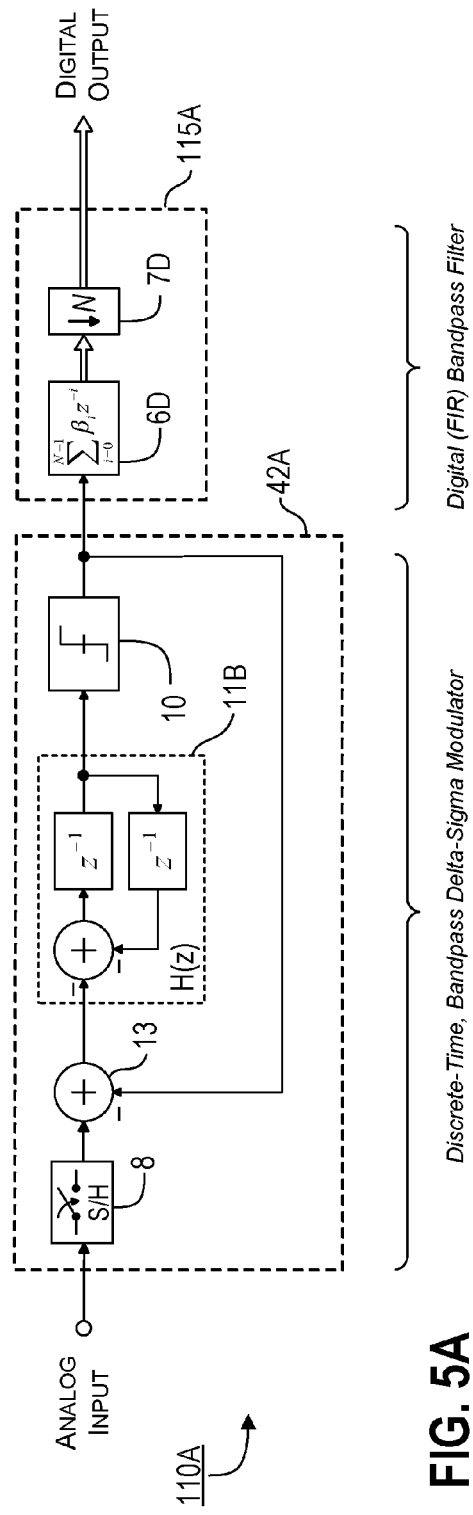
FIG. 5A is a block diagram of a single-band bandpass oversampling converter having a discrete-time, interpolative delta-sigma modulator with second-order response.
Figure 5B:
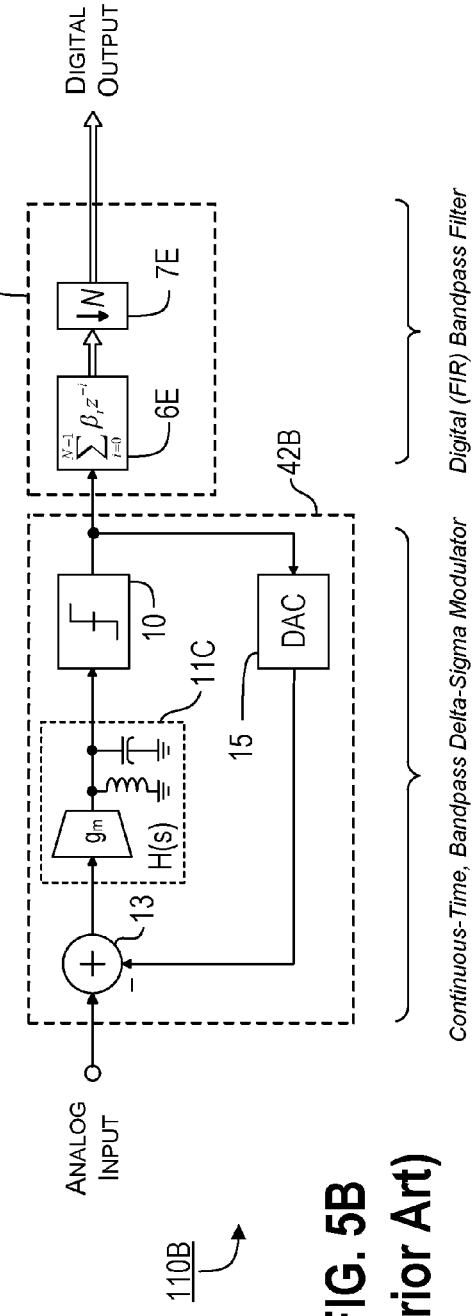
FIG. 5B is a block diagram of a single-band bandpass oversampling converter having a continuous-time, interpolative delta-sigma modulator with second-order response.
Figure 5C:
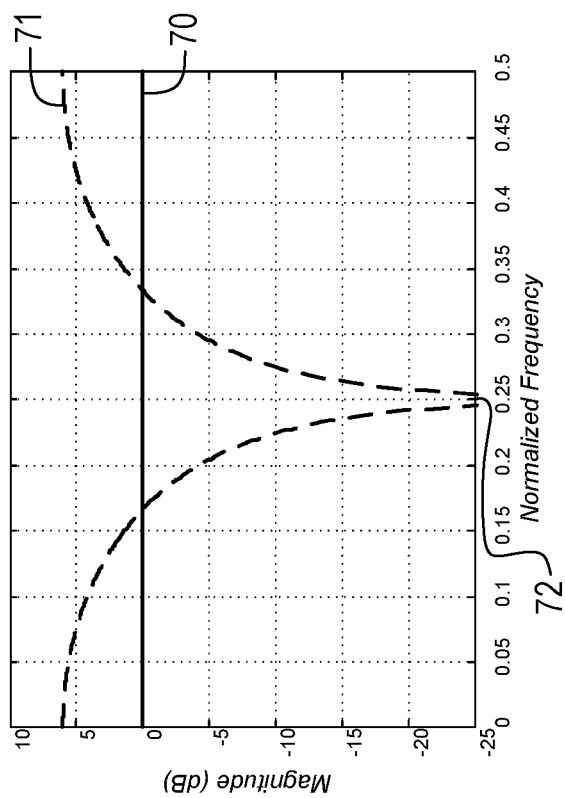
FIG. 5C illustrates the input signal transfer function (STF) and quantization-noise transfer function (NTF) for the delta-sigma modulator of the single-band bandpass converters shown in FIGS. 5A&B.

Various forms of bandpass noise shaping circuits can be used, such as: (1) conventional discrete-time (DT) delta-sigma ($\Delta\Sigma$) modulators; (2) conventional continuous-time (CT) delta-sigma ($\Delta\Sigma$) modulators; or (3) Diplexer Feedback Loops (DFLs). Exemplary bandpass oversampling converters 110A&B, illustrated in FIGS. 5A&B, respectively, employ a conventional bandpass delta-sigma modulator (e.g., modulator 42A or 42B), that provides, as shown in FIG. 5C, signal response 70 and quantization-noise response 71 with a minimum 72 at the center of the converter Nyquist bandwidth (i.e., $\frac{1}{4} \cdot f_S$). After single-bit high-speed quantization/sampling 10 (or, with respect to converter 110A shown in FIG. 5A, just quantization, sampling having been performed in sample-and-hold circuit 8), filtering 6D or 6E of quantization noise, similar to that performed in the standard conventional lowpass oversampling converter (e.g., converter 3C), is performed, followed by downsampling 7D or 7E.

Bandpass delta-sigma (ΔΣ) modulators are similar to the more-common lowpass variety in several respects: The conventional bandpass ΔΣ modulator has both discrete-time (e.g., converter 110A shown in FIG. 5A) and continuous-time (e.g., converter 110B shown in FIG. 5B) forms. Like the lowpass version, bandpass delta-sigma modulators 42A or 42B shape noise from quantizer 10 by performing a difference (i.e., delta) operation (e.g., subtractor 13) and an integration (i.e., sigma) operation (e.g., within integrator 11B or 11C), respectively, where integration is according to:

$$H(z) = -\frac{z^{-1}}{1+z^{-2}} \text{ or } H(s) = \frac{\sqrt{LC} \cdot s}{LC \cdot s^2 + 1} = \frac{\omega_0 \cdot s}{s^2 + \omega_0^2}\bigg|_{\omega_0 = \pi \cdot f_s/2}.$$

Also, the bandpass modulator processes the signal with one transfer function (STF) and the quantization noise with a different transfer function (NTF). The conventional bandpass DT ΔΣ modulator, shown in FIG. 5A, is considered second-order (i.e., P=2) and has a STF (z)=$z^{-1}$ and a NTF (z)=1+$z^{-2}$, where $z^{-1}$ represents a unit delay equal to 1/$f_S$. Linearized, continuous-time transfer functions for the second-order CT ΔΣ modulator, shown in FIG. 5B, are of the form:

$$STF(s) = \frac{\omega \cdot s}{s^2 + \omega \cdot s + \omega^2} \text{ and } NTF(s) = \frac{s^2 + \omega^2}{s^2 + \omega \cdot s + \omega^2}.$$

It should be noted that discrete-time modulators have a signal transfer function (STF) that generally is all-pass, whereas continuous-time modulators have a linearized signal transfer function (STF) that generally is not all-pass (e.g., bandpass for the above example). Also, the noise transfer function (NTF) of a real bandpass delta-sigma modulator is at minimum a second-order response.

Figure 6:
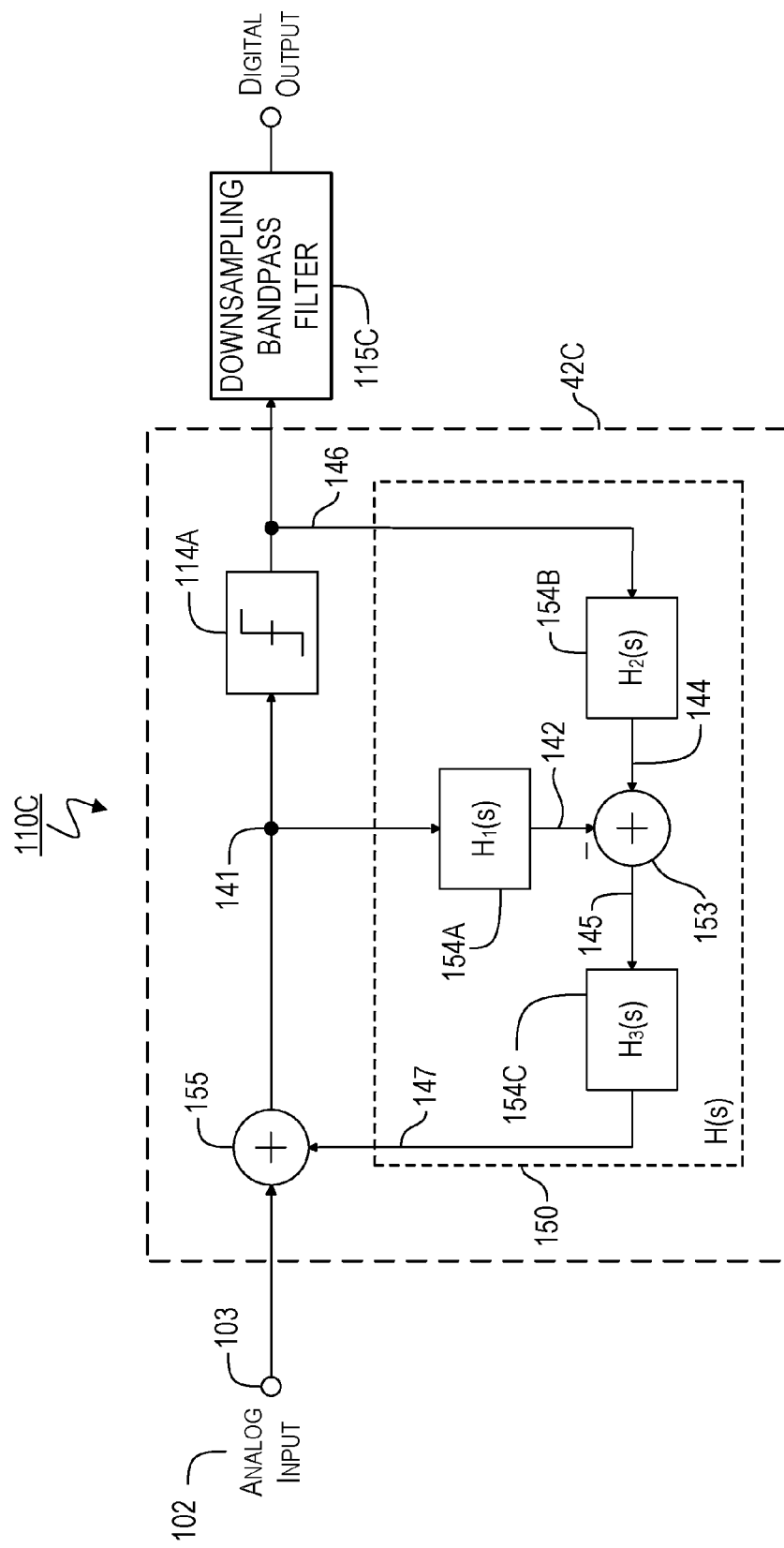
FIG. 6 is a block diagram illustrating a Diplexer Feedback Loop (DFL) according to a representative embodiment of the present invention that employs single-bit quantization and a feedback diplexer to produce quantization noise response minima at arbitrary frequencies.

Exemplary bandpass oversampling converter 110C, illustrated in FIG. 6, employs Diplexer Feedback Loop 42C for noise shaping. Referring to FIG. 6, the linearized signal transfer function (STF) and noise transfer function (NTF), between the input (e.g., input 103) and the output of the sampling/quantization circuit (e.g., quantizer 114A), are: STF (s)≈1 (i.e., approximately all-pass), and $$NTF(s) = \frac{1 + G \cdot H_1(s) \cdot H_3(s)}{1 + H_3(s) \cdot (G \cdot H_1(s) - H_2(s))},$$

where the convolution of the transfer function $H_1$(s) of filter 154A with the transfer function $H_3$(s) of filter 154C represents a first diplexer response, and the convolution of the transfer function $H_2$(s) of filter 154B with the transfer function $H_3$(s) of filter 154C represents a second diplexer response. More generally, the first and second diplexer responses are the linear combination of two filter responses $W_{ij}$(s), such that:

$$H_1(s) \cdot H_3(S) = \phi_{00} \cdot W_{OO}(s) + \phi_{01} \cdot W_{01}(s) \text{ and}$$

$$H_2(s) \cdot (s) = \phi_{10} \cdot W_{10}(s) + \phi_{11} \cdot W_{12}(s),$$

where $\phi_{ij}$ are positive or negative scalars. For the appropriate choice of $W_{ij}$(s), the characteristics of the NTF response are primarily determined by $\phi_{00}$ and $\phi_{01}$, with $\phi_{10}$ and $\phi_{11}$ having a secondary effect. In the present embodiment, varying the DFL tuning parameter $\phi_{00}$ over a range of −2 to +2 produces a spectral minimum ($f_{null}$) in the NTF response at an arbitrary frequency according to:

$$\varphi_{00} \approx -2 \cdot \cos\left(2 \cdot \pi \cdot \frac{f_{null}}{f_s}\right),$$

where $f_S$ is the clock frequency of sampling/quantization circuit 114A (i.e., the converter sampling frequency). In one embodiment, the spectral minima in the NTFs for the M processing branches are set to uniformly spaced frequency locations that span the frequency range of input signal 102. However, in other embodiments the spacing between frequency nulls may be non-uniform. More preferably, each DFL tuning parameter $\phi_{00}$ is implemented using an attenuator, amplifier or other circuit component that is adjustable in real time by the user, through the use of another external input signal and/or by other portions of overall converter 100A, so that the spectral noise minima in the branches 110A, 120A, 130A and 140A can be programmed to any desired values, e.g., for different intended uses.

The parameter $\phi_{01}$ can be varied to maximize the depth of the null in the DFL quantization noise transfer function (NTF), a condition that occurs when the overall insertion gain/loss of the first diplexer filter response (i.e., the convolution of filter $H_1$(s) 154A with filter $H_3$(s) 154C) is unity at the NTF frequency null ($f_{null}$). In certain embodiments, each parameter $\phi_{01}$ also is implemented using an attenuator, amplifier or other circuit component that is adjustable in real time by the user, through the use of another external input signal and/or by other portions of overall converter 100A, thereby permitting additional real-time configuration of the NTF frequency null depths.

The filter responses $W_{ij}$(s) preferably have group delay and insertion gain that are constant at frequencies lying within the 20 dB bandwidth of the NTF quantization noise response (i.e., frequencies near $f_{null}$) and approach zero at frequencies greater than those lying within the 20 dB bandwidth of the NTF quantization noise response (e.g., frequencies much greater than $f_{null}$). To maintain low complexity, the filter responses $W_{ij}$(s) preferably are lowpass responses of second to fifth order and, more preferably, are given by:

$$W_{ij}(s) = \frac{\beta''_{ij0} \cdot e^{-sT_{ij}}}{\sum_{k=0}^{5} \beta''_{ijk} \cdot s^k},$$

such that each of the diplexer filter responses $H_1$(s)·$H_3$(s) and $H_2$(s)·$H_3$(s) includes a lowpass component. In this particular case, the amplitude response of the lowpass filter $W_{ij}$(s) is determined by the denominator coefficients $\beta''_{ijk}$, which establish the filter cutoff frequency $f_{3dB}$ and filter out-of-band, roll-off factor (e.g., 12 dB per octave for a second-order filter). The group delay (propagation delay) response of the lowpass filter $W_{ij}$(s) is determined by the denominator coefficients $\beta''_{ijk}$ and the coarse tuning (delay) parameter $T_{ij}$ in the numerator. Furthermore, the filter coefficients $\beta''_{ijk}$ can be derived using normalized filter polynomials for standard analog filter types, such as Bessel and equiripple filters which are preferable because they exhibit near constant group delay across the passband of the filter. As is well known, such filters can be implemented in a straightforward manner using conventional circuit components.

It is noted that in embodiments where one or more of the DFL tuning parameters are adjustable in real time, adjustments to them can be made manually or otherwise in direct response to a command to change their values. In addition, or instead, as discussed in greater detail below in connection with FIGS. 8A&B, for example, their values can be adjusted automatically so as to mirror the frequency band selected by the bandpass filter (e.g., filter 115, 125, 135 or 145) in the same branch.

In the preferred embodiments, each of the quantization-noise-shaping circuits (e.g., noise shaping circuits 113, 123, 133 or 143 in conjunction with quantizers 114A) is the DFL circuit 110C, illustrated in FIG. 6, because such a circuit has been found to achieve the best combination of effectiveness, ease of construction and ease of configuration. However, it should be noted that it is possible to use other kinds of noise shaping circuits in alternate embodiments of the invention, such as either of the bandpass $\Delta\Sigma$ modulator circuits described above (e.g., modulators 42A&B). In any event, the primary considerations for the noise shaping circuits to be used preferably derive from the desire for: (1) reliable, high-performance operation at very high sample rates (i.e., to maximize converter input bandwidth); (2) stable and accurate operation across a wide range of frequency bands (i.e., performance that is not dependent on the location of the spectral minimum in the NTF response); and (3) flexible circuit operation with a simple means of varying/programming the location of the spectral minimum in the NTF response. Therefore, each noise shaping circuit according to the preferred embodiments has at least the following four properties: (1) the primary performance impairments of the noise shaping circuit, such as those related to settling-time errors, sampling uncertainty/jitter, thermal noise, and quantization/rounding errors, are subject to shaping noise-shaped response; (2) the performance of the noise shaping circuit is relatively insensitive to non-ideal circuit behavior and excess feedback loop delay; (3) the noise shaping circuit can be implemented using high-frequency design techniques, such as those utilizing distributed-element circuits and monolithic microwave integrated circuits (MMICs); and (4) the NTF response (and, in particular, the spectral minimum) of the noise shaping circuit is determined by circuit parameters that can be electronically modified during operation. Achieving these preferred properties generally precludes the use of conventional delta-sigma modulators for the noise shaping operation.

Figure 7A:
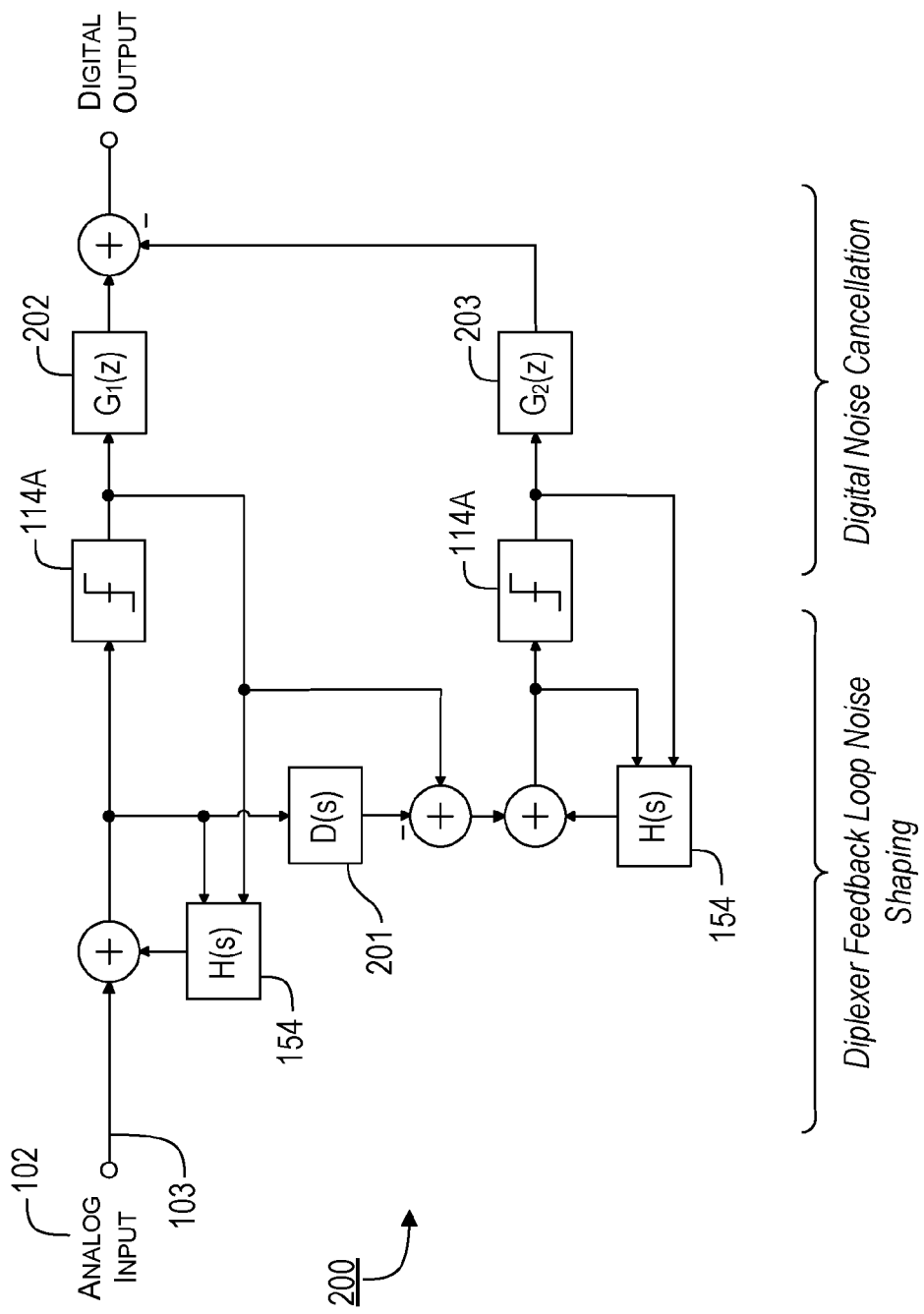
FIG. 7A is a block diagram of an exemplary Diplexer Feedback Loop (DFL) which produces a fourth-order noise-shaped response using a parallel circuit arrangement.

The DFL circuit shown in FIG. 6 has a second-order, noise-shaped response. However, like the MASH (i.e., Multi-stAge SHaping) structures used with conventional DT $\Delta\Sigma$ modulators (e.g., structures used with circuit 5C in FIG. 2A), it is possible to realize improved noise-shaped performance by adding additional DFL stages in a parallel arrangement to create higher-order responses. An exemplary fourth-order parallel DFL 200) is shown in FIG. 7A. Higher-order cascade (i.e., series) structures also are possible, but the parallel arrangement generally exhibits better stability than the cascade structure, particularly for high-order (i.e., >3) noise shaping and single-bit quantization. However, the parallel structure generally requires the digital interface to handle two single-bit inputs rather than one single-bit input. The transfer functions of additional filters 201, 202 and 203 shown in FIG. 7A preferably are:

$$D(s) = e^{-sT_S}$$

$$G_1(z) = z^{-1} \text{ and}$$

$$G_2(z) = 1 + \rho_1 \cdot z^{-1} + \rho_0 \cdot z^{-2},$$

respectively, where $T_S$ is the quantizer sample clock period and the $\rho_i$ values are chosen such that the response of $G_2(z)$ closely matches the NTF response of the first DFL stage within the signal bandwidth of the associated processing branch. Higher-order noise-shaped responses generally enable more quantization noise to be removed by the Bandpass Moving Average (or other bandpass) filter(s) that follow the noise shaping circuit (preferably a DFL).

In addition to shifting more quantization noise away from the frequency band of the input signal (e.g., signal 102) that is being processed by the current processing branch (e.g., branch 110A, 120A, 130A or 140A), use of higher-order noise-shaped responses provides a means of increasing the bandwidth of the noise transfer function (NTF). A second-order, bandpass NTF can produce a spectral minimum (i.e., a spectral zero) at a single frequency, while a fourth-order, bandpass NTF can produce spectral minima at two frequencies. In general, the number of spectral minima possible is equal to the order of the noise-shaped response divided by two (i.e., P/2). By making the NTF zeros more unequal (i.e., zero-optimized NTF), it is possible to increase the width of the quantization noise null at the expense of reducing the depth of the quantization noise null. The bandwidth of the NTF bandstop response can be found directly from the NTF frequency response magnitude, which as a function of angular frequency $\omega$, is approximately given by $$|H_{NTF}(\omega)| = |(1 - \cos(\zeta_1 \cdot T_S) \cdot e^{-j \cdot 2 \cdot \omega \cdot T_S}) \cdot (1 - \cos(\zeta_2 \cdot T_S) \cdot e^{-j \cdot \omega \cdot T_S} + e^{-j \cdot 2 \cdot \omega \cdot T_S})|,$$

where $\zeta_i$ are the angular frequencies at which NTF spectral minima occur and $T_S$ is the sample period of sampling/quantization circuit 114A (i.e., $T_S = 1/f_S$).

Figure 7B:
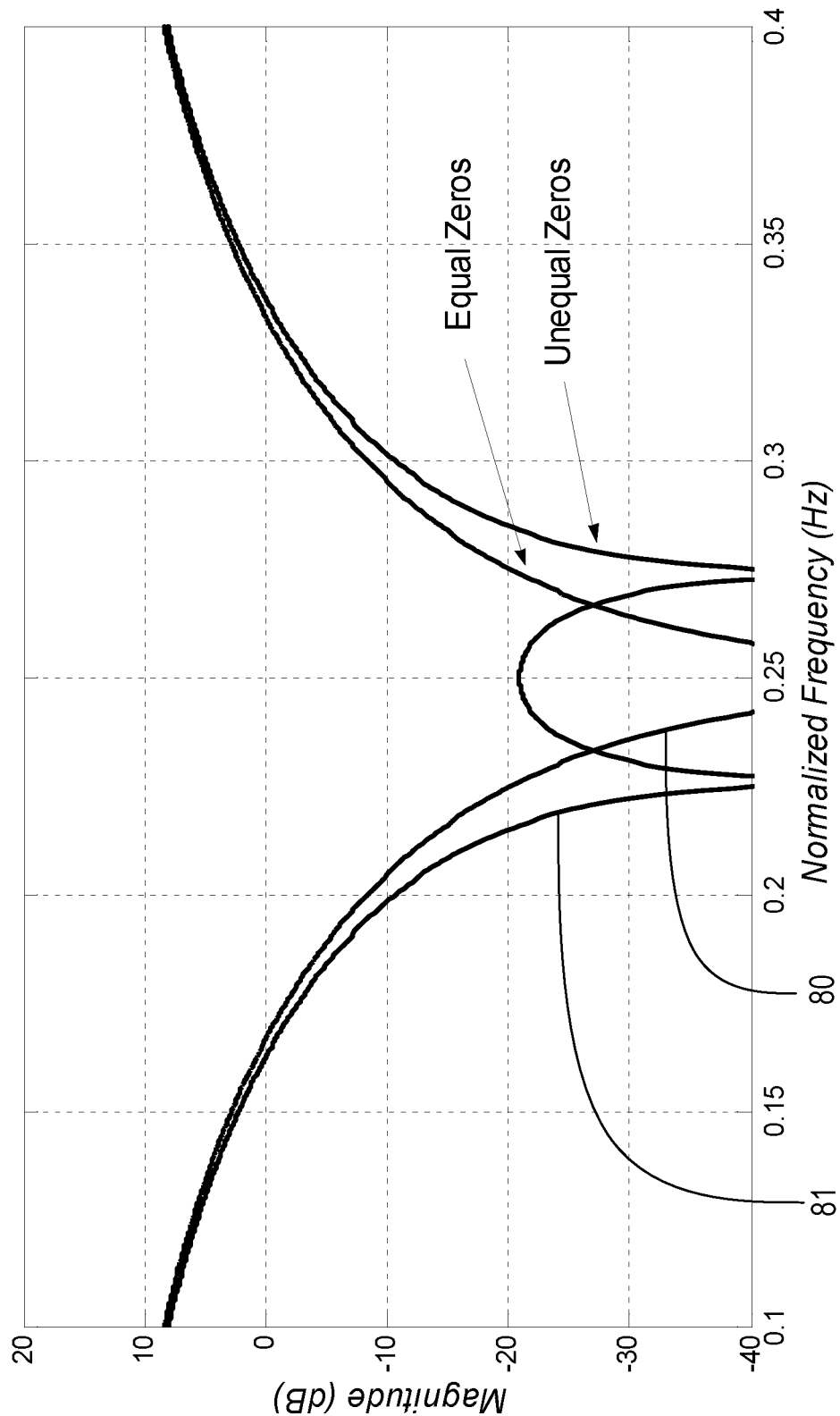
FIG. 7B illustrates noise transfer functions (NTFs) for exemplary fourth-order Diplexer Feedback Loops (DFLs) with equal spectral zeros and with unequal spectral zeros.

FIG. 7B illustrates a comparison of the noise transfer functions for two cases: (1) a conventional $4^{th}$ order noise-shaped response with equal zeros; and (2) a 4th order noise-shaped response with unequal zeros. As shown in FIG. 7B, the exemplary NTF with equal zeros (e.g., frequency response 80) has a noise null reaching a depth of greater than 40 dB at a normalized frequency of 0.25 Hz, whereas the depth of the exemplary NTF with unequal zeros (e.g., frequency response 81) reaches a depth of just greater than 20 dB. However, compared to the NTF with equal zeros and frequency response 80, the NTF with unequal zeros and frequency response 81 has a 20-dB bandwidth that is approximately 40% wider (0.07 Hz versus 0.05 Hz). For converters with a small number M of parallel processing branches (e.g., 110A-140A), a wider-band NTF with lower maximum attenuation can result in less noise at the output of the digital bandpass filter (e.g., filter 115C in FIG. 6) than a narrow-band NTF with higher maximum attenuation. Therefore, independent control of the tuning parameters $\phi_{ij}$ for each stage of a fourth-order, or higher, DFL provides a means of controlling both the center frequency and the bandwidth of the NTF bandstop response.

Figure 8A:
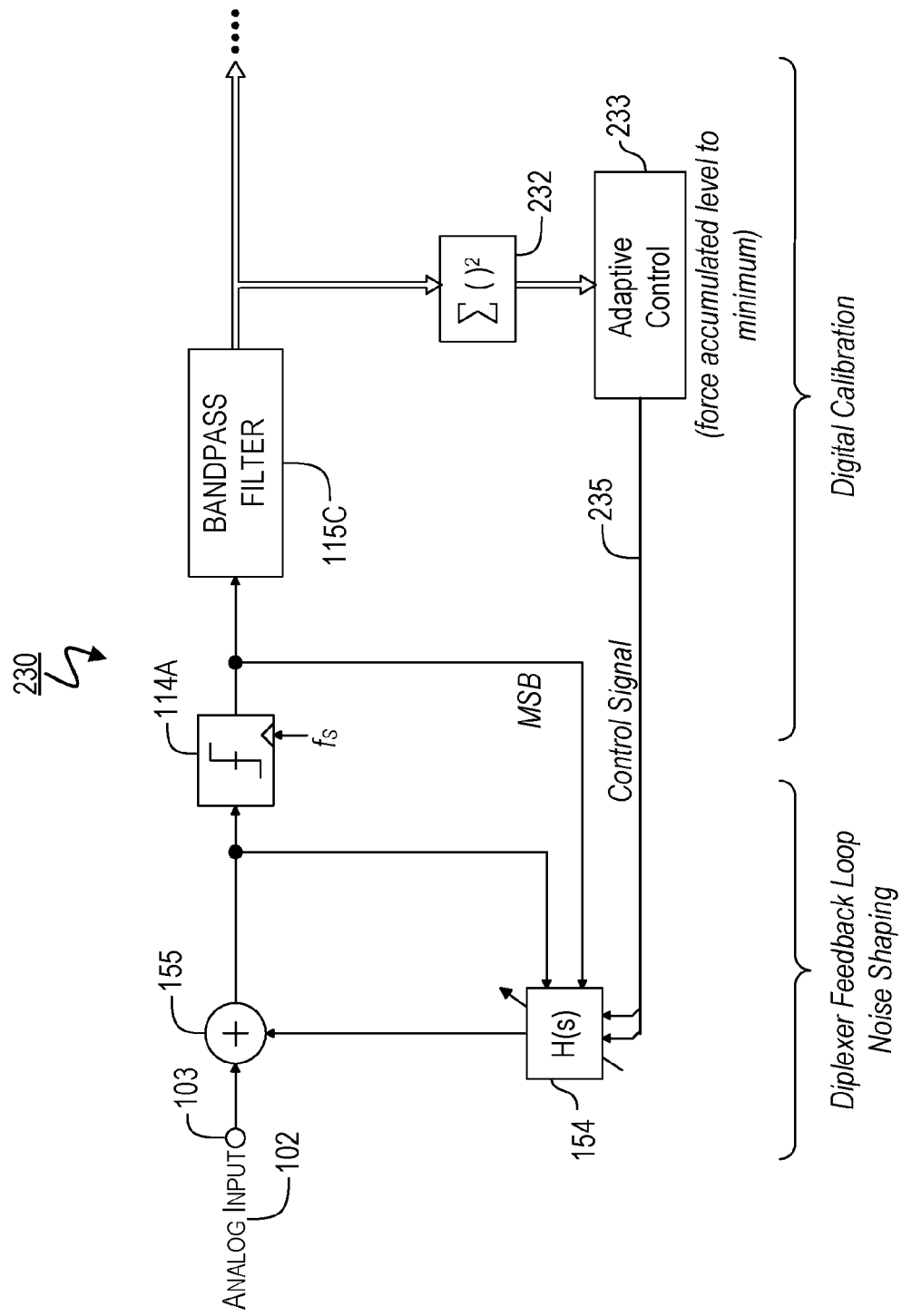
FIGS. 8A&B illustrate second- and fourth-order Diplexer Feedback Loops (DFLs), respectively, that use active calibration to optimize a noise-shaped response.
Figure 8B:
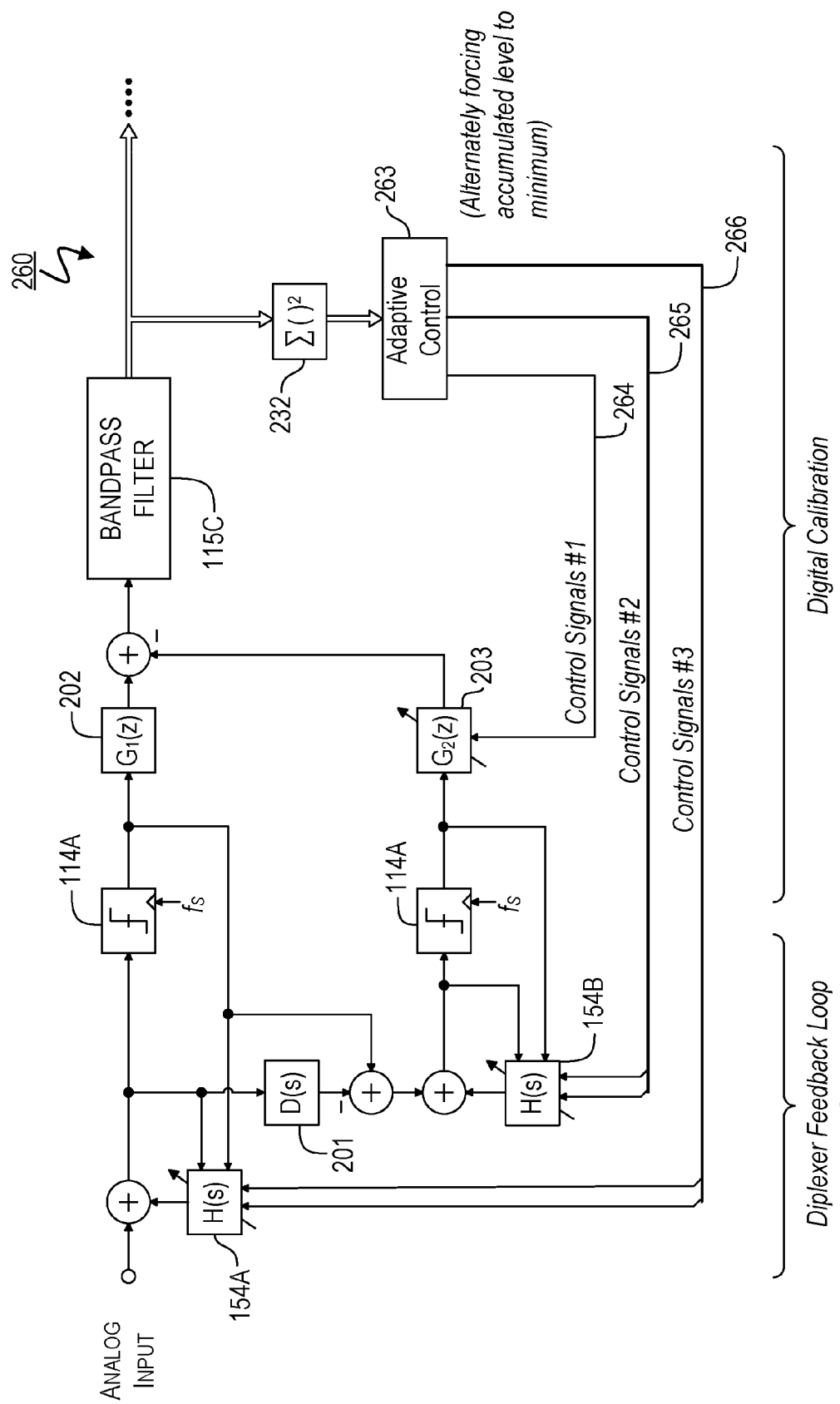

In addition, the DFL tuning parameters $\phi_{ij}$ can be dynamically adjusted to compensate for manufacturing tolerances. Exemplary DFL 230 shown in FIG. 8A provides compensation (i.e., coefficient tuning) for single-stage noise shaping, and exemplary DFL 260 shown in FIG. 8B provides compensation for multi-stage noise shaping. Because the quantization noise of the DFL is additive with respect to the input signal, the level at the output of bandpass filter 115C is proportional to the level of added quantization noise. When the DFL response is properly tuned, such that parameters $\phi_{ij}$ produce a quantization noise null at the correct frequency (i.e., the center frequency of the digital bandpass filter response), the added quantization noise is at a minimum. By sensing the power at the output of bandpass filter 115C, using square-law operation 232 (as shown in FIGS. 8A&B), an absolute-value operation or any other component for sensing signal strength, it is possible to adjust the DFL tuning parameters $\phi_{ij}$ using, e.g., an algorithm (implemented within processing block 233 in circuit 230 or within processing block 263 in circuit 260) that employs, e.g., joint optimization, decision-directed feedback, gradient descent, and/or least squared error (LSE) principles, until the level at the output of bandpass filter 115C is forced to a minimum. With respect to circuit 230, based on the level at the output of bandpass filter 115C (e.g., as determined in block 232), the algorithm generates control signal(s) 235 that correct for errors in the DFL response by adjusting the tuning parameters $\phi_{ij}$. With respect to circuit 260, based on the level at the output of bandpass filter 115C (e.g., as determined in block 232), the algorithm generates control signals 265 and 266 that correct for errors in the response of each DFL stage (e.g., the response of circuits 154A and 154B), and generates control signal 264 that adjusts the response of filter 203 to compensate for feedback loop gain errors in the first stage of the noise shaping circuit (i.e., the stage where the DFL includes circuit 154A).

The desired accuracy in the placement of $f_{null}$ depends on the intended resolution of the data converter, which is commonly specified in terms of effective number of bits, B. For example, an oversampled converter with M branches having quantization noise responses $NTF_i$, has a resolution of $$B = -\frac{1}{2} \cdot \log_2 \sum_{i=1}^{M} \left( \int_0^{f_S/2} |NTF_i(e^{2\pi jfT}, P) \cdot F_i(e^{2\pi jfT})|^2 \, df \right),$$

where $F_i(e^{2\pi jfT})$ are the frequency responses of the digital bandpass filters (e.g., filters 115, 125, 135 and 145). The resolution of the converter improves rapidly as DFL parameter accuracy improves to better than ±1%. Data converter applications targeting effective resolution of 10 bits or more preferably have DFL parameter tolerances of better than ±0.1% (~½$^9$100%). On the other hand, data converter applications targeting less effective resolution can accommodate larger tolerances. For example, tolerances of ±3% usually are sufficient for data converter applications targeting effective resolution of 5 bits or less. Although electronic components can be manufactured to accuracies of ±1% or better, use of active calibration as described above, allows the DFL fine tuning parameters, $\phi_{ij}$, to be dynamically adjusted, or adjusted based on manufacturing trim operations.

Downsampling Bandpass Filter Considerations

Regardless of implementation, the primary considerations for the digital, downsampling bandpass filters (e.g., filter 115) used in multi-mode conversion according to the preferred embodiments of the present invention are: (1) design complexity (preferably expressed in terms of required multiplications and additions), (2) frequency response (particularly stopband attenuation), (3) amplitude and phase distortion, and (4) latency. The best frequency selectivity (and typically as a result, the best converter-resolution performance) currently is believed to be obtained for bandpass filters having frequency responses that exhibit high stopband attenuation, which generally increases with increasing filter order (e.g., increasing of the impulse response length). In addition, it is preferable for the filter responses to have suitable (e.g., perfect or near-perfect) signal-reconstruction properties, which enable the outputs of multiple processing branches to be combined in single, composite channels without introducing appreciable performance degradation due to amplitude and phase distortion. For example, it can be shown that the decimating sinc$^{P+1}$ (comb) filter responses that conventionally have been considered near-optimal in conventional oversampling (noise shaping) converters do not in fact exhibit the near-perfect reconstruction filter bank properties that are preferred. Filter (i.e., amplitude and phase) distortion is a particularly important consideration because, unlike quantization noise, filter distortion levels do not improve as filter order increases, and with respect to embodiments that include noise shaping (e.g., MBO converter 100A), do not improve as the number of parallel-processing branches M increases. Therefore, filter distortion prevents converter resolution from improving with increasing filter order or with increasing M Also, although stopband attenuation generally increases with filter order, increases in filter order result in greater processing latency, especially for transversal, finite-impulse-response (FIR) filters. Bandpass filters with low latency are preferred to support applications where latency can be a concern, such as those involving control systems and servo mechanisms. For these reasons, the multi-mode converter preferably employs Bandpass Moving Average (BMA) filters, which can result in: (1) high levels of stopband (i.e., quantization noise) attenuation, (2) insignificant amplitude and phase distortion, and (3) significantly lower complexity than other approaches.

With respect to embodiments that include noise shaping (e.g., embodiments which employ MBO techniques), the desired bandpass filter frequency response preferably depends on the intended resolution of the converter (B), on the order of the noise-shaped transfer function (P), and on the effective oversampling ratio of the converter (M×N). For an oversampling converter with M processing branches, $$B = -\frac{1}{2} \cdot \log_2 \left[ \sum_{i=1}^{M} \left( \int_0^{f_S/2} |NTF_i(e^{2\pi jfT}, P) \cdot F_i(e^{2\pi jfT})|^2 \, df \right) \right]$$

where $NTF_i(e^{2\pi jfT}, P)$ are noise-shaped transfer functions of order P, where $F_i(e^{2\pi jfT})$ are the frequency responses of the digital bandpass (signal reconstruction) filters, and where the square-bracketed term in the above equation represents an overall level of quantization noise attenuation. In addition, for near-perfect signal reconstruction in combining the outputs of multiple processing branches, the digital bandpass filter responses preferably introduces negligible or no amplitude and phase distortion. Near-perfect signal reconstruction preferably requires that:

$$\sum_{i=1}^{M} F_i(z) = k \cdot z^{-n}, \text{ for } k = \text{constant} \quad \text{(i.e., strictly complementary)}$$

$$\sum_{i=1}^{M} |F_i(e^{2\pi jfT})|^2 = \text{constant} \quad \text{(i.e., power complementary)}$$

$$\sum_{i=1}^{M} F_i(z) = A(z), \quad \text{(i.e., all-pass complementary)}$$

for $A(z) \to \text{all-pass}$

To the extent that the digital bandpass filter bank introduces appreciable amplitude and phase distortion, the minimum signal-to-distortion power ratio (SDR) of the filter bank preferably depends on the intended effective resolution (B) of the converter, and is approximately given by SDR≥6·B, or 6 dB per bit.

For high-resolution converter applications (e.g., requiring up to 10 bits of conversion accuracy), the present inventor has discovered that conventional, transversal window filters (e.g., Blackman-Harris, Hann or Kaiser window filters) have suitable quantization noise attenuation and signal-reconstruction properties for one-sided bandwidths of ½·$f_S$/(N·M) and impulse-response lengths of 4·N·M, or less, where M is the number of processing branches and N is the excess-rate oversampling ratio (i.e., N≈½·$f_S$/$f_B$). However, the present inventor has also discovered that recursive window filters are a preferable alternative to conventional, transversal FIR filter banks (and comb filters), because recursive window filters exhibit equivalent properties to transversal window filters, but typically can be implemented more efficiently, i.e., with fewer adds (adders or addition operations) and multiplies (multipliers or multiplication operations). For example, consider a lowpass prototype (i.e., zero-frequency-centered) filter with impulse response $$h_{win}(n) = a_0 - a_1 \cdot \cos\left(\frac{2\pi n}{L-1}\right) + a_2 \cdot \cos\left(\frac{4\pi n}{L-1}\right) - a_3 \cdot \cos\left(\frac{6\pi n}{L-1}\right),$$

where $a_0$=0.35875, $a_1$=0.48829, $a_2$=0.14128, $a_3$=0.01168, and L=4·(N·M−1). This filter, which conventionally is defined as a Blackman-Harris window filter, realizes signal-to-distortion power ratios of greater than 84 dB (i.e., 14-bit resolution) and provides greater than 59 decibels (dB) of quantization noise attenuation (i.e., ~10-bit resolution), for fourth-order noise shaping and an effective oversampling ratio N·M=64. As significantly, this filter has a recursive transfer function equal to $$T_{win}(z) = a_0 \cdot \frac{1-z^{-L}}{1-z^{-1}} - \sum_{i=1}^{3} a_i \cdot \frac{1-\cos\left(\frac{2\pi i}{L-1}\right) \cdot (z^{-1}+z^{-L}) + z^{-(L+1)}}{1-2\cdot\cos\left(\frac{2\pi i}{L-1}\right) \cdot z^{-1} + z^{-2}},$$

which requires only 10 multiply operations for lowpass filtering, regardless of the filter impulse response length L. Additional multiplication operations are required for transforming the lowpass prototype response to a bandpass response, using downconversion followed by upconversion, but the recursive window filters still represent a considerable complexity savings over the transversal FIR approaches used in conventional filter banks. However, the present inventor has discovered that when recursive window filters of this form are implemented using high-frequency, parallel-processing methods, such as polyphase decomposition, the complexity costs associated with coefficient dynamic range expansion can exceed any complexity savings afforded by the recursive structure.

Figure 9A:
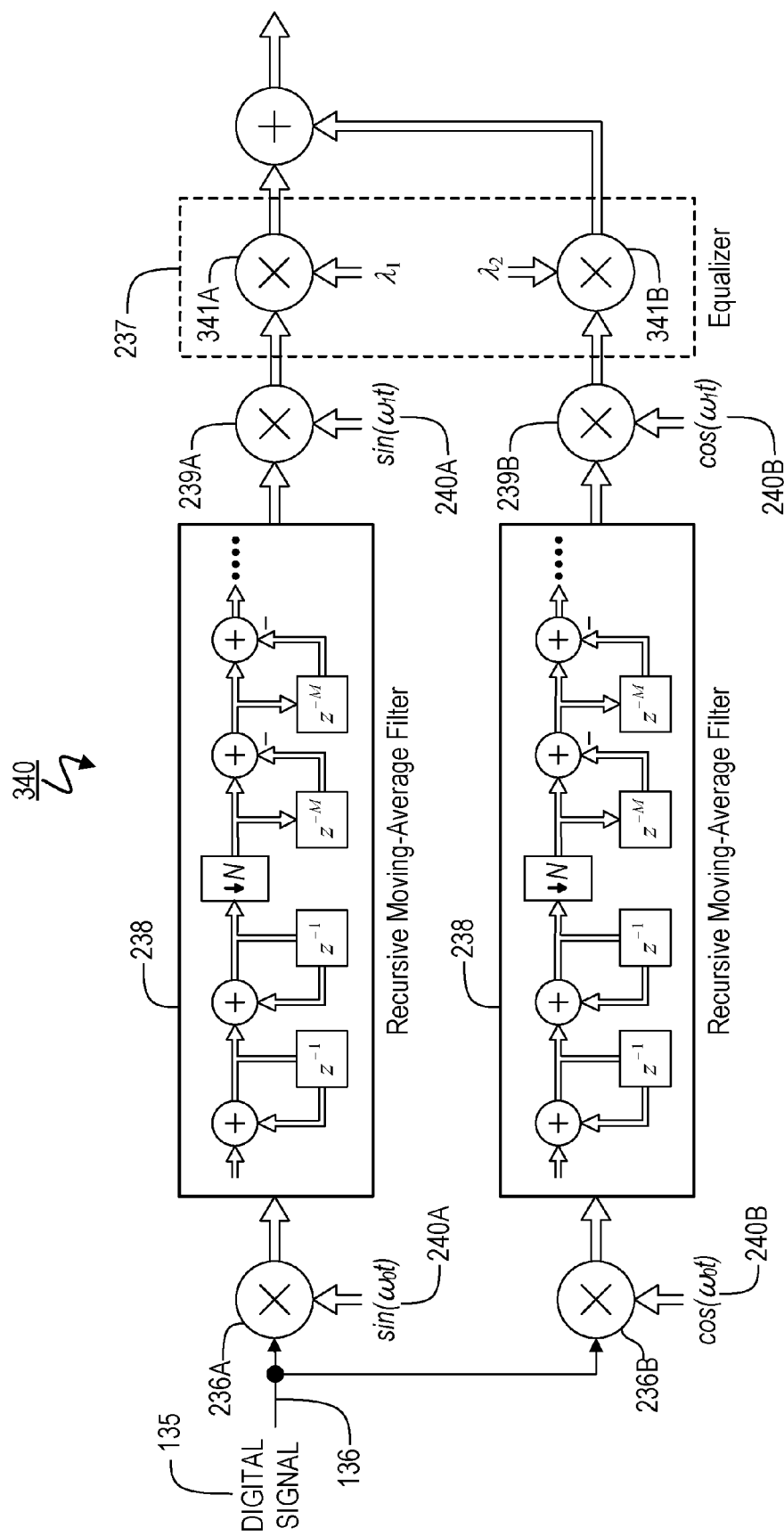
FIG. 9A is a block diagram of a Bandpass Moving Average (BMA) signal-reconstruction filter according to a representative embodiment of the invention that includes a single, complex tap equalizer and recursive moving-average filters with quadrature frequency conversion.

Bandpass Moving Average (BMA) filters are used in the preferred embodiments of the invention, instead of conventional transversal window filters or recursive window filters, because BMA filters feature high stopband attenuation, in conjunction with low complexity, and produce negligible amplitude and phase distortion when the outputs of multiple processing branches are combined into a single, composite channel. A block diagram of an exemplary BMA filter (e.g., filter 340) is given in FIG. 9A. As FIG. 9A illustrates, a BMA filter according to the present embodiment of the invention consists of: (1) a quadrature downconverter (i.e., dual multipliers 236A&B) that uses discrete-time sine and cosine sequences to shift the band of input digital signal 135 from a center frequency of $\omega_0$ (i.e., the center frequency of the associated processing branch) to a center frequency of zero; (2) an array (e.g., circuit 238) of one or more cascaded moving-average filters (MAFs) that preferably attenuate quantization noise without introducing appreciable amplitude or phase distortion, using operations comprising only addition, a decimation (i.e., downsample-by-N operation), and pipeline delay (i.e., but no multiplication); (3) a complex single-tap equalizer (e.g., circuit 237 comprised of dual multipliers 341A&B) that applies an amplitude and/or phase correction factor to the output of the moving-average filters (i.e., via scalar coefficients $\lambda_1$ and $\lambda_2$); and (4) a quadrature upconverter (i.e., dual multipliers 239A&B) that uses sine and cosine sequences to shift the output of equalizer 237 from a center frequency of zero back to a center frequency of $\omega_0$ (i.e., the original center frequency of the associated processing branch). Alternatively, the upconverter can shift by a frequency different than $\phi_0$, such as where it is desired for overall output signal 108 to be a baseband-shifted version of input signal 102. BMA 340 preferably introduces negligible amplitude and phase distortion by combining cascaded moving-average filters (e.g., moving-average filters within block 238), having an overall response with near-perfect reconstruction properties, with sinusoid-based quadrature downconversion 236A&B and upconversion 239A&B operations for transforming prototype BMA 340 lowpass responses to bandpass responses.

The BMA equalizer (e.g., equalizer 237), shown as a complex single tap filter in FIG. 9A, corrects for phase and/or amplitude (i.e., gain) offsets that may occur among the various parallel processing branches, for example, due to: (1) analog component tolerances and/or (2) noise shaping circuits (e.g., DFL or ΔΣ modulators within exemplary MBO converter 100A) with a signal transfer function (STF) that deviates from an ideal all-pass response (e.g., the STF may be approximately all-pass, but not precisely all-pass, across the bandwidth of a given MBO processing branch). The degree to which the STF deviates from an ideal all-pass response is directly related to the bandwidth of a given MBO (noise-shaped) processing branch. When all the MBO branches have equal processing bandwidth (i.e., uniform spacing of processing branch center frequencies), the bandwidth of each MBO processing branch is given by $f_S$/(N·M), where $f_S$ is the converter sample rate and NM is the converter effective oversampling ratio. Single tap equalizer 237 adds little additional complexity to BMA filter 340 (i.e., two multipliers), and therefore, is preferable for large effective oversampling ratios, such as for NM>50, because relatively narrow MBO processing branch bandwidths result in STFs that deviate little from an ideal all-pass response. However, the added complexity of multi-tap equalizers (i.e., implemented as transversal or recursive structures) is preferable for small effective oversampling ratios, such as for N·M≤10, because wider MBO processing branch bandwidths result in STFs that exhibit greater deviation from an ideal all-pass response. As will be readily appreciated, BMA equalizer 237 can be moved upstream of the moving-average filters (e.g., block 238), and/or any portion or all of the desired transfer function of equalizer 237 can be moved upstream of the moving-average filters, without affecting the overall transfer function of BMA filter 340.

The moving-average prototype filters utilized in the Bandpass Moving Average (BMA) filters preferably have the general transfer function $$F(z) = \prod_{i=0}^{R-1} \left( \frac{1 - z^{-2NM/K_i}}{1 - z^{-1}} \right)^{p_i},$$

where filter parameters R, $K_i$ and $p_i$ are integers, and the product $-2 \cdot N \cdot M/K_i$ is also an integer. This moving-average prototype filter is the product (cascade) of R frequency responses $H'_i(f)$ that are that are the discrete-time equivalent of a zero-order hold function (i.e., a discrete-time moving-average approximates a continuous-time zero-order hold). The frequency response of a zero-order hold has a magnitude that varies with frequency according to a sin(x)/x function, and therefore, the frequency response of the moving-average prototype has a magnitude that varies approximately with frequency according to the product of raised sin(x)/x functions (i.e., sin(x)/x functions raised to an exponent), such that $$|H'_i(f)| \approx \left( \frac{\sin(n \cdot \pi \cdot f / f_s)}{n \cdot \pi \cdot f / f_s} \right)^{p_i},$$

where n is the length of the moving-average window (i.e., $n = 2 \cdot N \cdot M / K_i$) and $f_S$ is the sampling rate of the moving-average filter (i.e., the converter sample rate). The approximation in the above equation reflects a difference between a discrete-time (moving-average) and a continuous-time zero-order hold response. Any filter function that approximates a zero-order hold response can, in the preferred embodiments, provide a sufficient basis for generating the overall response of the moving-average prototype. Additionally, this moving-average prototype filter has a one-sided, 3 dB bandwidth $$f_{3dB} \approx \frac{1}{2} \cdot \frac{f_S}{2 \cdot N \cdot M / K_i},$$

where M is the number of processing branches, N is the bandpass filter downsampling (decimation) factor (i.e., the filter decimation factor determines the converter excess-rate oversampling ratio), and $K_i$ is a constant. Therefore, the one-sided bandwidth of the moving-average prototype filter is directly proportional to N, and for M filters (i.e., M processing branches), the overall, two-sided bandwidth of the composite BMA filter bank is $f_S/N$. To preserve the bandwidth of the input signal, the integer decimation factor N is preferably set such that $f_S/N \geq f_B$. The input center frequency of each BMA filter is determined directly by the period of the sine and cosine sequences used for quadrature downconversion, and preferably is set to coincide with the intended center frequency of operation for the corresponding processing branch (e.g., the location of the spectral minimum $f_{null}$ in the NTF response of embodiments that employ MBO techniques). The output center frequency of each BMA filter is determined directly by the period of the sine and cosine sequences used for quadrature upconversion, and preferably is set to produce a baseband version of the input signal (i.e., center frequency approximately equal to one-half the input signal bandwidth $f_B$). More preferably, both the decimation factor N and the center frequency ($\omega_i$) of the BMA filter in each branch preferably is dynamically adjustable by the user, through the use of another external input signal and/or by other portions of overall converters 100A&B, so that the converter can be programmed in real time for a variety of different desired frequency bands.

The complexity of the prototype moving-average filter increases as the number of cascaded stages S increases, and therefore, S which is given by $$S = \sum_{i=0}^{R-1} p_i,$$

is preferably small, e.g., $S \leq 3$. The quantization noise attenuation ($A_{QN}$) of the BMA filter bank increases with increasing prototype filter impulse response length, L, given by $$L = 1 + \sum_{i=0}^{R-1} p_i \cdot (2NM/K_i - 1).$$

The amplitude and phase distortion introduced by the BMA filter bank is minimized (i.e., maximum SDR) for prototype filter impulse responses of length $L \leq 4 \cdot N \cdot M - 1$, where as before, M is the number of processing branches and N is the converter excess-rate oversampling ratio. Thus, for maximum converter resolution, the prototype filter parameters R, $K_i$ and $p_i$ preferably result in a prototype filter of length $L = 4 \cdot N \cdot M \cdot 1$, or as close to that as possible. However, filter quantization noise attenuation ($A_{QN}$) is not a one-to-one function of L. Specifically, some L-length prototype moving-average filters realize greater quantization noise attenuation than other L-length prototype moving-average filters. More preferably, therefore, the three BMA prototype filter parameters are optimized, for example using trial-and-error or a conventional constrained optimization method, such that both signal-to-distortion ratio (SDR) and quantization noise attenuation ($A_{QN}$) meet the minimum levels needed to achieve a specified converter resolution (e.g., both SDR and $A_{QN}$ preferably exceeding ~60 dB for 10-bit resolution)

Figure 9B:
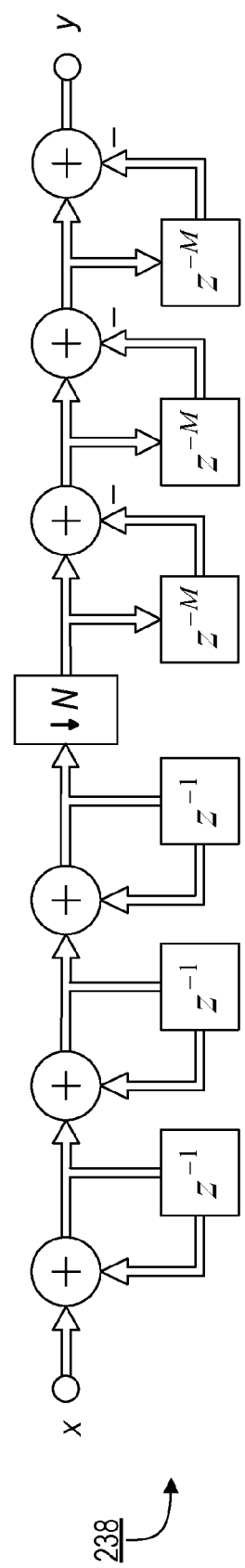
FIG. 9B is a block diagram illustrating a representative form of a recursive moving-average prototype filter for BMA bandpass filtering.

Besides exhibiting near-perfect reconstruction properties and realizing high levels of quantization noise attenuation, cascaded moving-average prototype filters can be very low in complexity because they require no multiplication operations. For example, the 3-stage (i.e., S=3) prototype filter transfer function given by $$F(z) = \left( \frac{1 - z^{-2NM}}{1 - z^{-1}} \right) \left( \frac{1 - z^{-NM}}{1 - z^{-1}} \right)^2$$

requires only 6 additions, independent of filter length (L=4·NM·2), plus 4·M+3 registers, as illustrated by the exemplary moving-average prototype filter 238 in FIG. 9B. With these moving-average prototype filters, the only multiplication operations required are those necessary for transforming lowpass responses to bandpass responses. Bandpass transformation based on quadrature downconversion and upconversion, as shown in FIG. 9A, requires only 4 multiplies when direct digital synthesis (e.g., employing digital accumulators with sine/cosine lookup memories) is used to generate the sine ($x_n$) and cosine ($y_n$) sequences, shown in FIG. 9A as sin($\omega_i t$) signals 240A and cos($\omega_i t$) signals 240B, that are used for the quadrature downconversion and upconversion operations. Alternatively, the sine ($x_n$) and cosine ($y_n$) sequences can be generated using CORDICs (i.e., COordinate Rotation DIgital Computer) or other recursive operations that require no (lookup table) memory, such as those represented by the following conventional difference equations:

$$x_n = \cos(\omega_0) \cdot x_{n-1} + \sin(\omega_0) \cdot y_{n-1}$$

$$y_n = \cos(\omega_0) \cdot y_{n-1} - \sin(\omega_0) \cdot x_{n-1}$$

with initial conditions $$x_0 = A \cdot \sin(w_0 - \theta), y_0 = A \cdot \cos(\omega_0 - 0).$$

Although Bandpass Moving Average (BMA) filters based on cascaded moving-average filter (MAF) prototypes, such as filter 238 described above, generally are preferred because such structures provide a substantial savings in computational complexity, particularly for large M (i.e., M≥8), the conventional, transversal FIR filter bank and transversal window filter approaches can provide equal or less complexity for small M The exemplary prototype filter with transfer function F(z), is the product of three discrete-time responses, each of which being analogous to a zero-order hold in continuous-time (i.e., each discrete-time response approximates a continuous-time zero-order hold). The first of these discrete-time responses is a moving-average function with a window of length 2·N·M samples, which approximates a zero-order hold with duration $\tau_1 = 2 \cdot N \cdot M / f_S$ seconds. A zero-order hold with duration $\tau_1$ seconds, can be shown to have a magnitude that varies with frequency according to $$|H'_1(f)| = \frac{\sin(\pi \cdot f \cdot \tau_1)}{\pi \cdot f \cdot \tau_1},$$

or a sin(x)/x function raised to the power of one. The second and third of these discrete-time responses are moving-average functions with a window of length N·M samples. In unison, these second and third discrete-time responses approximate two zero-order holds in cascade, each with duration $\tau_2 = N \cdot M / f_S$ seconds. In cascade, a pair of zero-order holds with duration $\tau_2$ seconds, can be shown to have a magnitude that varies with frequency according to $$|H'_2(f)| = \left(\frac{\sin(\pi \cdot f \cdot \tau_2)}{\pi \cdot f \cdot \tau_2}\right)^2,$$

or a sin(x)/x function raised to the power of two. Therefore, the exemplary moving-average prototype with frequency response F(z) has a magnitude that varies approximately with frequency according to $$|H'_1(f)| \cdot |H'_2(f)| = \left(\frac{\sin(\pi \cdot f \cdot \tau_1)}{\pi \cdot f \cdot \tau_1}\right) \cdot \left(\frac{\sin(\pi \cdot f \cdot \tau_2)}{\pi \cdot f \cdot \tau_2}\right)^2,$$

or equivalently, that varies approximately with frequency according to the product of raised sin(x)/x functions: a first sin(x)/x function that is raised to a power of one, and a second sin(x)/x function that is raised to a power of two. As illustrated using the exemplary prototype filter with transfer function F(z), the overall response of the moving-average prototype preferably is generated by filter functions that approximate (continuous-time) zero-order holds.

In applications involving very high conversion rates, multi-rate filter structures based on polyphase decomposition can significantly reduce the clock speeds at which the BMA circuitry (e.g., digital multipliers and adders) operates. For example, consider a moving-average operation with transfer function $$T_{mAvg}(z) = \frac{1 - z^{-N}}{1 - z^{-1}}.$$

The above moving-average operation can be represented by the difference equation $$y_n = x_n - x_{n-N} + y_{n-1},$$

and therefore, the difference equations for the first two output samples (i.e., n=1, 2) are $$y_2 = x_2 - x_{2-N} + y_1 \text{ and } y_1 = x_1 - x_{1-N} + y_0.$$

Substitution of $y_i$ into $y_2$ results in $$y_2 = x_2 - x_{2-N} + (x_1 - x_{1-N} + y_0) = x_2 + x_1 - x_{2-N} - x_{1-N} + y_0,$$

and the preceding equation can be generalized to $$y_n = x_n + x_{n-1} - x_{n-N-1} + y_{n-2}.$$

Figure 10:
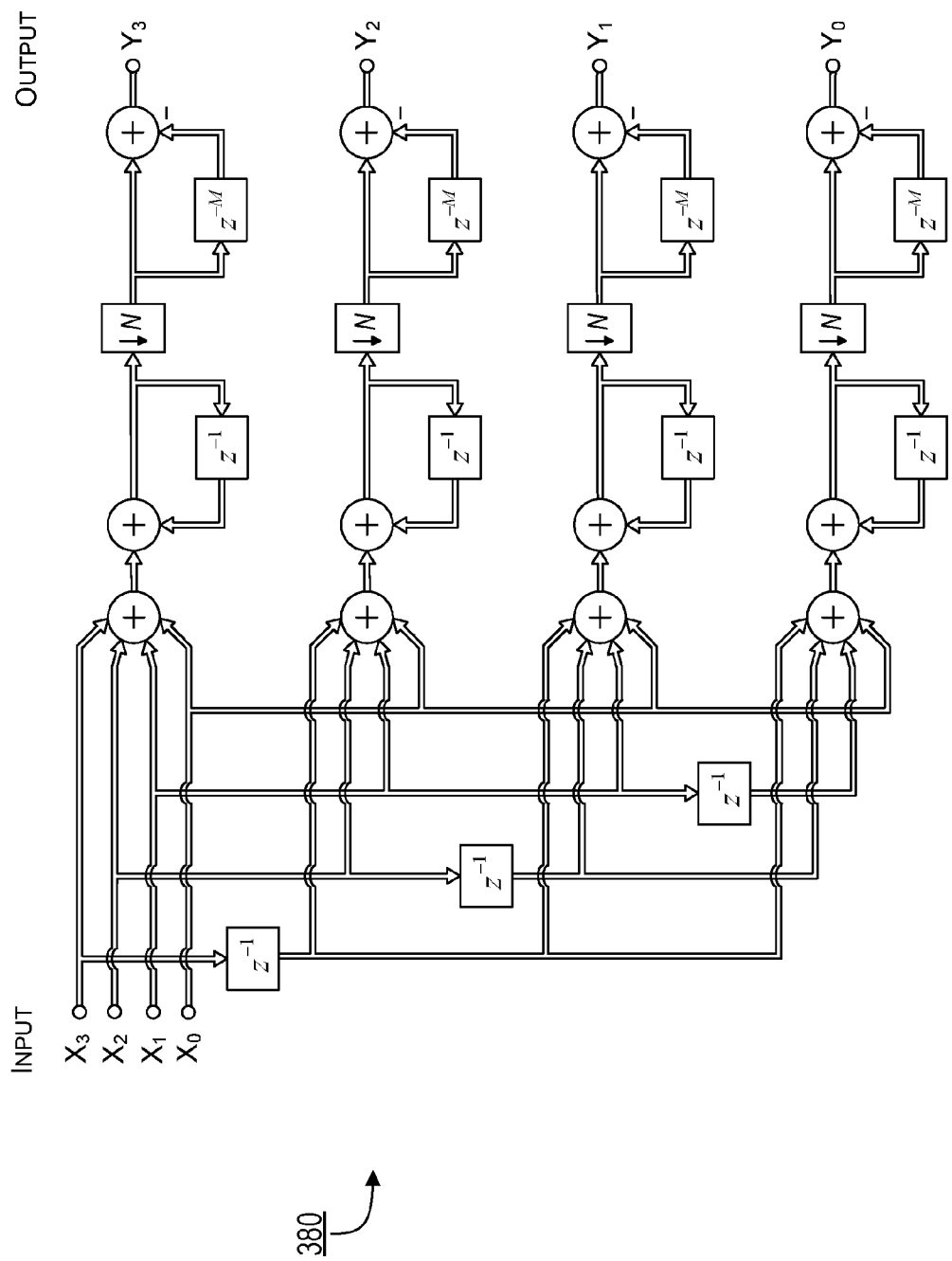
FIG. 10 is a simplified block diagram of a multi-rate, recursive moving-average filter having a polyphase decomposition factor of m=4.

Because the calculation of $y_n$ requires only inputs and outputs that have been delayed by two or more samples in the above example, the moving-average function can be instantiated as a structure with two polyphase processing paths, each running at one-half the effective clock rate. The above technique can be extended to reduce clock rates further by using additional hardware to increase the number of polyphase processing paths. For example, FIG. 10 shows a block diagram for a moving-average filter (e.g., filter 380) implemented using four polyphase processing paths (i.e., polyphase decomposition factor of m=4). As illustrated in FIG. 9B (i.e., a moving-average filter with 3-stages), the basic recursive form of the moving-average filter uses two adders and M+1 registers per stage. Also, as shown in FIG. 10 for a polyphase decomposition factor of m=4, a multi-rate implementation of a single-stage filter requires 24 adders and 4·M+7 registers for integer ratios of M/n. In general, for a polyphase decomposition factor of m and for M processing branches, the multi-rate moving-average filter requires $m^2 + 2 \cdot m$ adders and $m \cdot (M+2) - 1$ registers for integer ratios of M/n. Thus, ignoring registers, the complexity of the multi-rate, moving-average filter increases as $O(m^2)$ relative to the basic form of the filter.

Overall Converter Considerations

With respect to embodiments where noise shaping is employed (e.g., multi-mode MBO converter 100A of FIG. 3A), the input bandwidth typically is limited only by the maximum sample rate ($f_S$) of the sampling/quantization circuits (e.g., quantizers 114A). This sample rate, in turn, can be maximized by implementing quantizers 114A as high-speed comparators (i.e., 1-bit quantizers), which currently can have instantaneous bandwidths greater than 10 GHz (i.e., $f_S$=20 GHz). Comparators having such bandwidths are commercially available in SiGe and InP™ integrated circuit process technology.

As noted previously, the resolution performance of embodiments where MBO techniques are employed (e.g., MBO converter 100A), can be increased without increasing the converter sample rate by increasing the number of processing branches M the order of the noise-shaped response P, and/or the stopband attenuation of the digital bandpass filters. For example, it can be shown that with respect to the number of processing branches M, converter resolution improves by approximately P bits/octave (i.e., doubling M increases converter resolution by P bits). In addition, multi-mode MBO converters that employ DFLs for noise shaping, are relatively insensitive to impairments such as clock jitter and thermal noise that degrade the performance of other multi-mode converter architectures. This is because quantizer impairments such as clock jitter and harmonic distortion are subjected to the DFL noise-shaped response in a similar manner to quantization noise, exhibiting a frequency response that enables significant attenuation by the bandpass (i.e., preferably BMA) filters (e.g., filters 115 and 125).

Simulated conversion resolution performance results for the multi-mode MBO converter are given in Table 1 for: (a) 12.5 GHz sample rate (i.e., $f_S=12.5$ GHz), (b) 4 processing branches (i.e., M=4), (c) $4^{th}$-order noise shaping (i.e., P=4), and (d) various input signal bandwidths $f_B$. As the tabulated results indicate, conversion resolution improves by approximately 2.5 bits per octave reduction in signal bandwidth $f_B$, compared to conventional multi-mode approaches where conversion resolution improves by only 0.5 bits for every octave reduction in signal bandwidth.

TABLE 1

Simulated Performance Results for Multi-Mode Converter ($f_S$ = 12.5 GHz)

| Signal Bandwidth $f_B$ (MHz) | Effective Oversampling Ratio (N × M) | Conversion Resolution (effective bits) |
|---|---|---|
| 125 | 200 | 16.0 |
| 250 | 100 | 13.7 |
| 500 | 50 | 11.0 |
| 1000 | 25 | 7.0 |

Summarizing, as compared to the conventional methods, a multi-mode converter based on Multi-Channel Bandpass Oversampling (MBO) generally can provide high-resolution, linear-to-discrete signal transformation (ADC conversion):

with input bandwidth limited only by the maximum clock frequency of a one-bit comparator (e.g., greater than 10 GHz instantaneous bandwidth with commercially available SiGe or InP™ process technology);

with conversion resolution and accuracy that increases by 0.5 (P+1) effective bits per octave reduction in input signal bandwidth $f_B$, where P is the order of the noise-shaped response;

with conversion resolution and accuracy that increases by 0.5 (P+1) effective bits per octave increase in the number of parallel processing branches M, where P is the order of the noise-shaped response;

with conversion resolution that, due to DFL noise shaping, is relatively insensitive to traditional analog-to-digital conversion impairments, such as clock jitter, thermal noise, quantizer errors, and component tolerances that affect settling-time, bandwidth and gain;

with continuous-time, noise shaping based on Diplexer Feedback Loops that can be implemented using distributed microwave design principles and can be actively calibrated using relatively simple control loops and error metrics;

with digital signal processing operations that can be implemented using low-complexity moving-average filters and using polyphase decomposition to reduce required clock rates; and with a novel method that combines filter bank (i.e., multirate) signal processing with bandpass oversampling to eliminate the need for complex analog downconversion and tunable analog filtering operations.

Figure 11:
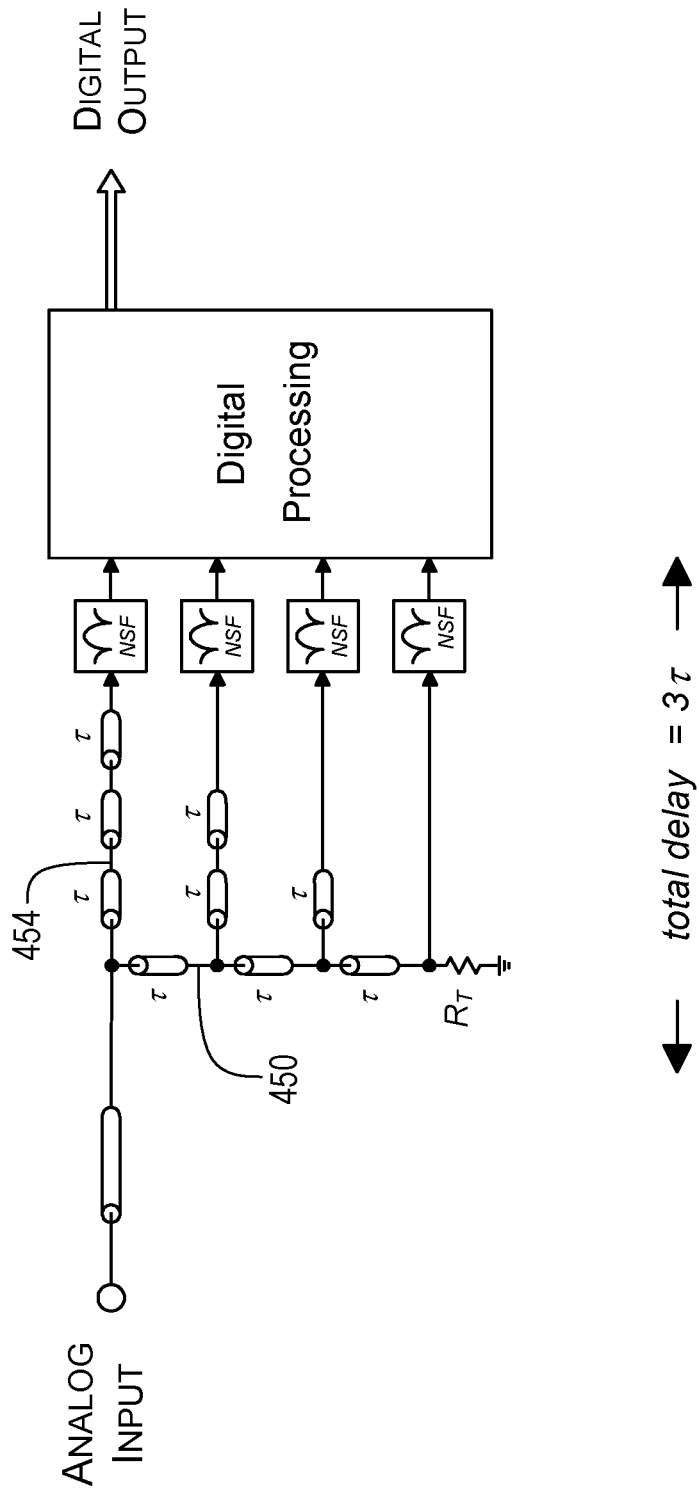
FIG. 11 is a block diagram of a complete converter illustrating an exemplary method for signal distribution across four processing branches which employ noise-shaped quantization.

Because the input to each DFL noise shaping circuit can be designed for high impedance (>200 ohms), it is possible to "tap off" multiple noise shaping circuits (e.g., circuit 113 in FIG. 3A) from a single controlled impedance transmission (i.e., signal distribution) line as shown in FIG. 11. For a 50-ohm system with noise shaping circuits having greater than 200 ohm input impedances, preferably fewer than 8 noise shapers are tapped off common transmission (i.e., signal distribution) line 450 to prevent appreciable loss of signal integrity. The tapped transmission line arrangement simplifies the distribution of the data converter's single analog input to the multiple processing branches in the array. Although not illustrated in FIG. 11, this tapped transmission line technique can be combined with conventional signal-distribution approaches, such as those employing power splitters, m-ary diplexers, and distribution amplifiers, to achieve an optimal trade-off between signal integrity, additive noise, and circuit complexity. Severe propagation skew (i.e., delay offsets) between the DFLs in the converter array can degrade conversion accuracy. Therefore, to ensure that the analog input signal propagates with equal (or approximately equal) delay to the output of each noise shaper in the array, transmission delay introduced by the tapped transmission line preferably is compensated with added delay 454 at the DFL inputs, as shown in FIG. 11. In the exemplary embodiment shown in FIG. 11, the delay between the analog input and each of the four DFL outputs is 3·τ.

Because the multi-mode converter is comprised of multiple, independent parallel-processing branches, by isolating or combining the outputs of various processing branches it is possible for the converter to operate in multiple modes. Exemplary operating modes include, but are not limited to: (1) a converter with M distinct channels (i.e., channel being defined by the center frequency $\omega_0$ at which data conversion takes place) where each channel has a conversion bandwidth that is determined by the bandwidth of the digital bandpass filter/response (i.e., bandwidth appropriate for the decimation factor N); (2) a converter with one channel having a processing bandwidth equal to the combined bandwidth of the M bandpass filters/responses; and (3) a converter with n<M channels. In general, the number of operating modes is restricted only by the constraints that: (1) the total number of output channels does not exceed the number of processing branches M, and (2) the sum total of all channel processing bandwidths does not exceed the input bandwidth of the converter (i.e., the Nyquist bandwidth of ½·$f_S$).

Figure 12:
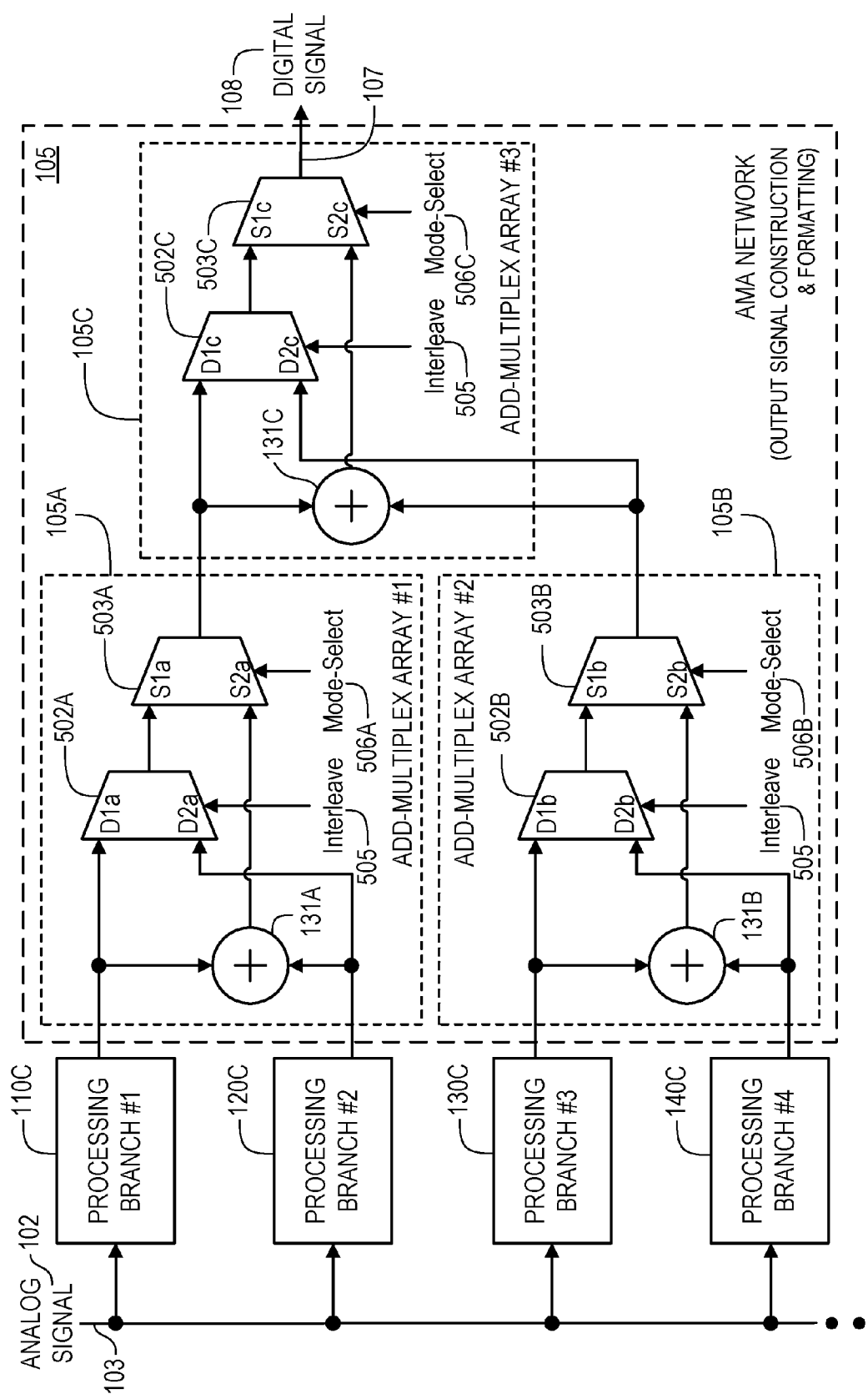
FIG. 12 is a block diagram of a multi-mode converter that employs multiple Add-Multiplex Arrays (AMAs) in an AMA, e.g., to enable: (a) isolation of individual processing branches for operation as multiple narrowband output channels, or (b) combination of individual processing branches for operation as fewer wideband output channels.

Multi-mode operation of the converter is enabled by the addition of an innovation referred to herein as an Add-Multiplex Array (AMA), which is illustrated by the exemplary, simplified block diagram in FIG. 12. As shown in FIG. 12, AMA 105 is placed between the various processing branches (110C, 120C, 130C and 140C) and the converter output (e.g., signal 108). Each of the add-multiplex cells (e.g., cells 105A-C) within AMA 105 preferably consists of: (1) an adder 131A-C with two inputs and one output, (2) an interleaving multiplexer 502A-C with two inputs and one output, and (3) a mode-select multiplexer 503A-C with two-inputs and one output. However, in alternate embodiments, these two-input/one-output functions can be substituted with multiple-input/multiple-output equivalents, such as, for example, by replacing two two-input/one-output functions with one four-input/two-output function. The interleave signal 505 that is input to each interleaving multiplexer 502A-C simply causes the multiplexer to produce an output signal by repeatedly alternating between its two inputs (i.e., producing a sequence of input 1, input 2, input 1, input 2 . . . ). As illustrated in FIG. 12, the output of each processing branch (i.e., branch 110C, 120C, 130C and 140C) is coupled to one input of an adder (e.g., one of adders 131A&B) and one input (e.g., one of inputs D1a&b and D2a&b) of an interleaving multiplexer (e.g., multiplexers 502A&B). The output of each interleaving multiplexer 502A-C is coupled to one input (i.e., inputs S1a-c) of a mode-select multiplexer (e.g., multiplexer 503A-C), with the other input (i.e., inputs S2a-c) of each mode-select multiplexer 503A-C being coupled to the output of one of the adders (e.g., adders 131A-C). As illustrated for the case of four processing branches (i.e., a 4:1 AMA), the output of each mode-select multiplexer 503A&B in turn is coupled to one input of adder 131C and one input (i.e., one of inputs D1c&D2c) of interleaving multiplexer 502C. The arrangement described above and shown in FIG. 12 for M=4 processing branches, can be extended to an arbitrary number of processing branches. Once again, as used herein, the term "coupled", or any other form of the word, is intended to mean either directly connected or connected through one or more other processing blocks, e.g., for the purpose of preprocessing.

Referring to the simplified AMA illustrated in FIG. 12, each of the mode-select multiplexers 503A-C is used to choose between a first data stream (e.g., S1a-c), consisting of alternating samples from two distinct data sources (e.g., the output of processing branch 110C and the output of processing branch 120C for mode-select multiplexer 503A), and a second data stream (e.g., S2a-c), which is the sum of the samples from the same two distinct data sources (e.g., the output of processing branch 110C summed with the output of processing branch 120C for mode-select multiplexer 503A). It should be noted that in the current embodiment the samples in the first data stream (i.e., S1a-c) are alternated between the two distinct sources in a manner that effectively reduces the data rate of each data source by a factor of two. A reduction in data rate by a factor of two is conventionally referred to as decimation-by-two, or down-sample-by-two. It should further be noted that samples in the second data stream (i.e., S2a-c) are generated by a summation operation between two distinct data sources (e.g., processing branch 110C output and processing branch 120C output) that involves no data rate decimation. Therefore, the data rates at both inputs (e.g., S1a and S2a) of mode-select multiplexers 503A-C are equal. Furthermore, each of the alternating samples in the first data stream represents a signal that has one-half the bandwidth of the signal represented by the sum of samples in the second data stream. In short, the mode-select signals (e.g., signals 506A-C) that are control inputs into each of multiplexers 503A-C, determine which input is provided at the multiplexer's output. In one case, the output provided by the mode-select multiplexer contains two channels, where the signals on each channel retain their separate identities (by interleaving the input channels' data values). In the other case, the output provided by the mode-select multiplexer contains a single channel, where two (originally separate) input signals have been combined into a single, composite signal (by adding the input data values). Thus, moving through the AMA chain, as data sources pass through interleaving (i.e., alternating samples) paths, channel bandwidth and data rate are reduced (i.e., decimated), whereas as data sources pass through summation (i.e., adder) paths, bandwidth and data rate are preserved (i.e., no decimation). At one extreme, is the case where the interleave path is routed through all the mode-select multiplexers (e.g., multiplexers 503A-C), resulting in a multi-channel mode of operation with M distinct channels. At the other extreme, is the case where the summation path is routed through all the mode-select multiplexers (e.g., multiplexers 503A-C), resulting in a single-channel mode of operation.

At the output 107 of AMA 105, distinct converter channels can be recovered as desired (although this step is unnecessary in the single-channel mode of operation) using a demultiplexing operation that extracts and collects samples from converter output data stream 108 at regular intervals, as determined by the mode-select multiplexer configuration. For example, when the converter is configured for multi-channel operation with M distinct channels, each of the M distinct channels can be recovered by extracting and collecting samples from the output, y(n), at M-sample intervals. More specifically, for M distinct channels, the first channel, $y_i(n)$, consists of samples $$y_1(n)=\{y(1),y(M+1),y(2M+1),y(3M+1),\ldots\},$$

the second channel, $y_2(n)$, consists of samples $$y_2(n)=\{y(2),y(M+2),y(2M+2),y(3M+2),\ldots\},$$

and accordingly, the last channel, $y_M(n)$, consists of samples $$y_M(n)=\{y(M),y(2M),y(4M),y(4M),\ldots\}$$

Demultiplexing techniques, such as that described above, are conventionally well understood. Also, since the AMA operation is most efficiently implemented when the number of processing branches is a power of two, a multi-mode converter according to the preferred embodiments employs an interleave factor of $M=2^n$, for integer n.

In the exemplary embodiment described above, signals are directly input to multiplexers 502A-C, and decimation occurs automatically when interleaving is performed. In alternate embodiments, however, any or all of such signals may be downsampled prior to being input into their corresponding multiplexers 502A-C, thereby permitting downsampling techniques other than simple decimation.

As indicated above, an AMA according to the present invention can have any of a variety of different configurations. Conceptually, the purpose of AMA 105 is to allow the user of the multi-mode converter (e.g., converters 100A&B) to be able to flexibly configure the nature of output signal 108 based on the outputs of the individual processing branches (e.g., branches 110C, 120C, 130C and 140C), each of which provides a different frequency band of the original input signal (e.g., signal 102), by merging channels (e.g., adjacent channels) or keeping them distinct, as desired. As a result, the basic architecture illustrated in FIG. 12 can be used in such various configurations, with the specific arrangement of adders and multiplexers being selected based on the kinds of channel-merging operations that are desired to be accommodated.

Finally, it should be noted that the frequency bands processed by the various branches (e.g., 110C or 120C) may be of equal or unequal widths. That is, rather than frequencies that are spaced uniformly across the converter output bandwidth, such frequencies instead can be non-uniformly spaced.

In the description set forth above, circuit components of the noise shaping circuits can be adjusted, parameters of the digital bandpass filters can be adjusted, and/or the ways in which outputs of the various processing branches are to be merged can be changed, all in real-time. This ability to flexibly configure a multi-mode converter (e.g., converters 100A&B) according to the present invention can allow users to tailor the output signal (e.g., signal 108) both to the original input signal (e.g., signal 102) and to the desired format in which the user would like to receive the output signal. Ordinarily, the user will want to configure the multi-mode converter so that the aggregate bandwidths of the different processing branches encompass the entire bandwidth of the input signal. However, the user instead might want to focus on just a portion of that bandwidth, in which case the aggregate bandwidths of the processing branches preferably would be set to cover only that portion. Also, different portions of the desired bandwidth can be processed with different resolutions by assigning a smaller bandwidth to one processing branch (thereby resulting in greater resolution for that subband) and a greater bandwidth to another processing branch (thereby resulting in lesser resolution for that subband). Still further, as discussed in detail above, in the preferred embodiments of the invention, the spectral resolution at which output signal 108 is provided is separately controllable from the spectral resolution at which input signal 102 is processed, through the use of an AMA or other channelizing circuit.

In certain embodiments, the detailed selection of the various circuit values, digital filter parameters and signal-merging options is handled automatically, and the user is provided with just a simple interface, e.g., for: inputting the frequency band of input signal 102 (or desired portion thereof); indicating whether the subbands (processed in the individual processing branches) are to have equal bandwidths or, if not, how they are to be allocated; and how output signal 108 is to be configured (as a single composite signal, as an interleaved set of distinct signals, or as a specified combination of the two). As a result, the user preferably has the option of reprocessing the same input signal (e.g., signal 102) in different ways, e.g., for different purposes and/or to focus in on certain aspects of a signal after performing a preliminary analysis.

System Environment

Generally speaking, except where clearly indicated otherwise, all of the systems, methods, functionality and techniques described herein can be practiced with the use of one or more programmable general-purpose computing devices. Such devices typically will include, for example, at least some of the following components interconnected with each other, e.g., via a common bus: one or more central processing units (CPUs); read-only memory (ROM); random access memory (RAM); input/output software and circuitry for interfacing with other devices (e.g., using a hardwired connection, such as a serial port, a parallel port, a USB connection or a FireWire connection, or using a wireless protocol, such as Bluetooth or a 802.11 protocol); software and circuitry for connecting to one or more networks, e.g., using a hardwired connection such as an Ethernet card or a wireless protocol, such as code division multiple access (CDMA), global system for mobile communications (GSM), Bluetooth, a 802.11 protocol, or any other cellular-based or non-cellular-based system, which networks, in turn, in many embodiments of the invention, connect to the Internet or to any other networks; a display (such as a cathode ray tube display, a liquid crystal display, an organic light-emitting display, a polymeric light-emitting display or any other thin-film display); other output devices (such as one or more speakers, a headphone set and a printer); one or more input devices (such as a mouse, touchpad, tablet, touch-sensitive display or other pointing device, a keyboard, a keypad, a microphone and a scanner); a mass storage unit (such as a hard disk drive or a solid-state drive); a real-time clock; a removable storage read/write device (such as for reading from and writing to RAM, a magnetic disk, a magnetic tape, an opto-magnetic disk, an optical disk, or the like); and a modem (e.g., for sending faxes or for connecting to the Internet or to any other computer network via a dial-up connection). In operation, the process steps to implement the above methods and functionality, to the extent performed by such a general-purpose computer, typically initially are stored in mass storage (e.g., a hard disk or solid-state drive), are downloaded into RAM and then are executed by the CPU out of RAM. However, in some cases the process steps initially are stored in RAM or ROM.

Suitable general-purpose programmable devices for use in implementing the present invention may be obtained from various vendors. In the various embodiments, different types of devices are used depending upon the size and complexity of the tasks. Such devices can include, e.g., mainframe computers, multiprocessor computers, workstations, personal (e.g., desktop, laptop, tablet or slate) computers and/or even smaller computers, such as PDAs, wireless telephones or any other programmable appliance or device, whether stand-alone, hard-wired into a network or wirelessly connected to a network.

In addition, although general-purpose programmable devices have been described above, in alternate embodiments one or more special-purpose processors or computers instead (or in addition) are used. In general, it should be noted that, except as expressly noted otherwise, any of the functionality described above can be implemented by a general-purpose processor executing software and/or firmware, by dedicated (e.g., logic-based) hardware, or any combination of these, with the particular implementation being selected based on known engineering tradeoffs. More specifically, where any process and/or functionality described above is implemented in a fixed, predetermined and/or logical manner, it can be accomplished by a processor executing programming (e.g., software or firmware), an appropriate arrangement of logic components (hardware), or any combination of the two, as will be readily appreciated by those skilled in the art. In other words, it is well-understood how to convert logical and/or arithmetic operations into instructions for performing such operations within a processor and/or into logic gate configurations for performing such operations; in fact, compilers typically are available for both kinds of conversions.

It should be understood that the present invention also relates to machine-readable tangible (or non-transitory) media on which are stored software or firmware program instructions (i.e., computer-executable process instructions) for performing the methods and functionality of this invention. Such media include, by way of example, magnetic disks, magnetic tape, optically readable media such as CDs and DVDs, or semiconductor memory such as PCMCIA cards, various types of memory cards, USB memory devices, solid-state drives, etc. In each case, the medium may take the form of a portable item such as a miniature disk drive or a small disk, diskette, cassette, cartridge, card, stick etc., or it may take the form of a relatively larger or less-mobile item such as a hard disk drive, ROM or RAM provided in a computer or other device. As used herein, unless clearly noted otherwise, references to computer-executable process steps stored on a computer-readable or machine-readable medium are intended to encompass situations in which such process steps are stored on a single medium, as well as situations in which such process steps are stored across multiple media.

The foregoing description primarily emphasizes electronic computers and devices. However, it should be understood that any other computing or other type of device instead may be used, such as a device utilizing any combination of electronic, optical, biological and chemical processing that is capable of performing basic logical and/or arithmetic operations.

In addition, where the present disclosure refers to a processor, computer, server device, computer-readable medium or other storage device, client device, or any other kind of device, such references should be understood as encompassing the use of plural such processors, computers, server devices, computer-readable media or other storage devices, client devices, or any other devices, except to the extent clearly indicated otherwise. For instance, a server generally can be implemented using a single device or a cluster of server devices (either local or geographically dispersed), e.g., with appropriate load balancing.

Additional Considerations

In the event of any conflict or inconsistency between the disclosure explicitly set forth herein or in the attached drawings, on the one hand, and any materials incorporated by reference herein, on the other, the present disclosure shall take precedence. In the event of any conflict or inconsistency between the disclosures of any applications or patents incorporated by reference herein, the more recently filed disclosure shall take precedence.

Several different embodiments of the present invention are described above, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the spirit and the scope of the invention. Accordingly, the invention is not limited to the precise embodiments shown in the drawings and described above. Rather, it is intended that all such variations not departing from the spirit of the invention be considered as within the scope thereof as limited solely by the claims appended hereto.

What is claimed is:

1. An apparatus for converting a continuous-time, continuously variable signal into a sampled and quantized signal, comprising:
    an input line for accepting an input signal that is continuous in time and continuously variable;
    a plurality of processing branches having inputs coupled to the input line, each of said processing branches including: (a) a bandpass noise-shaping circuit, (b) a sampling/quantization circuit coupled to an output of the bandpass noise-shaping circuit, and (c) a digital bandpass filter coupled to an output of the sampling/quantization circuit; and
    a combining circuit, coupled to outputs of a plurality of said processing branches, that combines signals on said outputs into a final output signal,
    wherein each of said digital bandpass filters includes: (a) a quadrature frequency downconverter, which uses discrete-time cosine and sine sequences to generate in-phase and quadrature outputs at baseband, (b) a first lowpass filter coupled to the in-phase output of the quadrature frequency downconverter, (c) a second lowpass filter coupled to the quadrature output of the quadrature frequency downconverter, and (d) a quadrature frequency upconverter coupled to outputs of the first and second moving-average filters, which uses discrete-time cosine and sine sequences to convert in-phase and quadrature inputs to a higher frequency output,
    wherein a center frequency of the digital bandpass filter in each said processing branch corresponds to a stopband region in a quantization noise transfer function for the bandpass noise-shaping circuit in the same processing branch,
    wherein the frequency response of each of said first and second lowpass filters has a magnitude that varies approximately with frequency according to the product of raised sin(x)/x functions, and
    wherein each of a plurality of said processing branches includes at least one adjustable parameter which, when adjusted, changes at least one of: (i) a frequency of at least one of the cosine or sine sequences, or (ii) a bandwidth of at least one of the first lowpass filter or the second lowpass filter.

2. An apparatus according to claim 1, wherein at least one of said first or said raised sin(x)/x functions included in said product for at least one of said first or said second lowpass filters is raised to a power that is equal to one.

3. An apparatus according to claim 1, wherein at least one of said raised sin(x)/x functions included in said product for at least one of said first or said second lowpass filters is raised to a power that is greater than one.

4. An apparatus according to claim 1, wherein the frequency response of at least one of said first or said second lowpass filters has a magnitude that varies approximately with frequency according to the product of a raised $sin(x_1)/x_1$ function and a raised $sin(x_2)/x_2$ function, where $x_1 \neq x_2$.

5. An apparatus according to claim 4, wherein $x_1 \geq 2x_2$.

6. An apparatus according to claim 1, wherein at least one of said plurality of processing branches further includes an additional adjustable parameter which, when adjusted, changes a location of a stopband region in the quantization-noise response of said bandpass noise-shaping circuit.

7. An apparatus according to claim 6, wherein a value of said additional adjustable parameter is determined by an active calibration mechanism.

8. An apparatus according to claim 1, wherein the at least one adjustable parameter for at least one of said plurality of processing branches includes a first adjustable parameter which, when adjusted, changes a location of a frequency response passband of said at least one processing branch and a second adjustable parameter which, when adjusted, changes a bandwidth of said frequency response passband.

9. An apparatus according to claim 1, wherein frequency responses of different ones of said processing branches are configured so as to select different frequency bands that collectively encompass an entire frequency range of the input signal.

10. An apparatus according to claim 1, wherein different ones of the plurality of processing branches have substantially identical circuit configurations.

11. An apparatus according to claim 1, wherein frequency responses of different ones of said processing branches are configured so as to have at least one of: (i) center frequencies that are spaced at non-equal intervals, and (ii) bandwidths that are not all equal to each other.

12. An apparatus according to claim 1, wherein frequency responses of different ones of said processing branches are configured so as to have at least one of: (i) center frequencies that are spaced at equal intervals, and (ii) bandwidths that are all equal to each other.

13. An apparatus according to claim 1, wherein at least one of the first and second lowpass filter responses is generated using a recursive operation.

14. An apparatus according to claim 1, wherein at least one of the first and second lowpass filters is comprised of at least one moving-average component.

15. An apparatus according to claim 1, wherein at least one of the lowpass filters includes a downsampling operation.

16. An apparatus according to claim 1, wherein at least one of the cosine or sine sequences is generated using a lookup memory operation.

17. An apparatus according to claim 1, wherein at least one of the cosine or sine sequences is generated using a recursive operation.

18. An apparatus according to claim 1, wherein at least one of the first and second lowpass filters is implemented as a polyphase decomposition structure.

19. An apparatus according to claim 18, wherein a polyphase decomposition factor, m, of the polyphase decomposition structure is a submultiple of the total number, M, of said processing branches.

20. An apparatus according to claim 1, wherein the combining circuit permits real-time configuration for determining whether individual outputs of said plurality of said processing branches are to be merged into a single composite signal or are to retain their separate identities.

21. An apparatus according to claim 20, wherein the combining circuit comprises an array of at least one adder for merging outputs of a plurality of said processing branches into a single composite signal and at least one multiplexer for multiplexing outputs to retain their separate identities.

22. An apparatus according to claim 20, wherein there are exactly M said processing branches, M being a power of two.

23. An apparatus according to claim 1, further comprising a sampling/quantization circuit having an input coupled to the input line and an output coupled to the inputs of the plurality of processing branches.

* * * * *